(12) United States Patent
Yoshida et al.

(10) Patent No.: US 9,059,010 B2
(45) Date of Patent: Jun. 16, 2015

(54) SEMICONDUCTOR DEVICE AND METHOD OF FORMING THE SAME

(75) Inventors: Masanori Yoshida, Tokyo (JP); Katsumi Sugawara, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 33 days.

(21) Appl. No.: 13/340,485

(22) Filed: Dec. 29, 2011

(65) Prior Publication Data

US 2012/0098145 A1 Apr. 26, 2012

Related U.S. Application Data

(63) Continuation of application No. 12/662,188, filed on Apr. 5, 2010, now abandoned.

(30) Foreign Application Priority Data

Apr. 8, 2009 (JP) ................................ P2009-093954

(51) Int. Cl.
*H01L 23/538* (2006.01)
*H01L 25/065* (2006.01)
*H01L 23/00* (2006.01)

(52) U.S. Cl.
CPC ............ *H01L 25/0657* (2013.01); *H01L 24/97* (2013.01); *H01L 2224/97* (2013.01); *H01L 2225/06513* (2013.01); *H01L 2225/06517* (2013.01); *H01L 2225/06541* (2013.01); *H01L 2225/06555* (2013.01); *H01L 2924/01029* (2013.01); *H01L 2924/01079* (2013.01); *H01L 2924/15311* (2013.01); *H01L 2924/01005* (2013.01); *H01L 2924/01006* (2013.01); *H01L 2924/01033* (2013.01); *H01L 2924/014* (2013.01)

(58) Field of Classification Search
USPC .................. 257/621, 686, 777, 790, E25.013, 257/E25.025, E25.027
See application file for complete search history.

(56) References Cited

U.S. PATENT DOCUMENTS 7,541,217 B1 * 6/2009 Shih et al. ..................... 438/109
2002/0132463 A1 * 9/2002 Urushima ..................... 438/613

(Continued)

FOREIGN PATENT DOCUMENTS

JP 2004-165283(A) 6/2004
JP 2005-244143(A) 9/2005

(Continued)

OTHER PUBLICATIONS

Office Action in U.S. Appl. No. 12/662,188 dated May 11, 2012.

(Continued)

*Primary Examiner* — Peniel M Gumedzoe
(74) *Attorney, Agent, or Firm* — Kunzler Law Group, PC

(57) ABSTRACT

A semiconductor device includes a chip stacked structure. The chip stacked structure may include, but is not limited to, first and second semiconductor chips. The first semiconductor chip has a first thickness. The second semiconductor chip has a second thickness that is thinner than the first thickness.

24 Claims, 11 Drawing Sheets

(56) References Cited

U.S. PATENT DOCUMENTS

| | | | |
|---|---|---|---|
| 2005/0001320 A1* | 1/2005 | Yamaguchi | 257/758 |
| 2005/0167812 A1 | 8/2005 | Yoshida et al. | |
| 2005/0189639 A1* | 9/2005 | Tanie et al. | 257/686 |
| 2006/0063312 A1 | 3/2006 | Kurita | |
| 2006/0214277 A1 | 9/2006 | Saeki | |
| 2006/0226556 A1 | 10/2006 | Kurita et al. | |
| 2006/0267188 A1* | 11/2006 | Ishino et al. | 257/723 |
| 2007/0001281 A1* | 1/2007 | Ishino et al. | 257/686 |
| 2007/0018320 A1* | 1/2007 | Tanida et al. | 257/737 |
| 2007/0045791 A1 | 3/2007 | Saeki | |
| 2007/0181991 A1 | 8/2007 | Ishino et al. | |
| 2007/0194455 A1* | 8/2007 | Ikeda et al. | 257/777 |
| 2008/0191364 A1* | 8/2008 | Kim et al. | 257/777 |
| 2008/0224322 A1 | 9/2008 | Shinogi | |
| 2008/0251897 A1* | 10/2008 | Kikuchi et al. | 257/666 |
| 2008/0296779 A1 | 12/2008 | Matsui et al. | |
| 2008/0308946 A1* | 12/2008 | Pratt | 257/777 |
| 2009/0001600 A1* | 1/2009 | Somani | 257/777 |
| 2010/0178761 A1* | 7/2010 | Chen et al. | 438/613 |

FOREIGN PATENT DOCUMENTS

| | | |
|---|---|---|
| JP | 2006-269861(A) | 10/2006 |
| JP | 2006-319243(A) | 11/2006 |
| JP | 2007-66932(A) | 3/2007 |
| JP | 2007-194444(A) | 8/2007 |
| JP | 2007-273782(A) | 10/2007 |
| JP | 2008-294367(A) | 12/2008 |

OTHER PUBLICATIONS

United States Office Action dated Feb. 7, 2013 in U.S. Appl. No. 12/662,188 (Previously Submitted).

United States Office Action dated Feb. 7, 2013 in U.S. Appl. No. 12/662,188.

English language translation of Japanese Office Action dated Nov. 26, 2013.

* cited by examiner

SEMICONDUCTOR DEVICE AND METHOD OF FORMING THE SAME

CROSS-REFERENCE OF RELATED APPLICATIONS

The present application is a Continuation application of U.S. patent application Ser. No. 12/662,188, filed on Apr. 5, 2010 now abandoned.

BACKGROUND OF THE INVENTION

1. Field of the Invention

The present invention relates to a semiconductor device and a method of forming the same.

Priority is claimed on Japanese Patent Application No. 2009-093954, filed Apr. 8, 2009, the content of which is incorporated herein by reference.

2. Description of the Related Art

In order to realize high speed performances, high density packaging and multi-functions of a semiconductor device, and a chip on chip technology has been studied and developed. The chip on chip will be hereinafter, referred to as CoC. In this technology, a plurality of semiconductor chips is stacked over a substrate. The stack of the semiconductor chips is packaged in a single semiconductor package at high density. The CoC technology can also be referred to as a multi-chip package technology, hereinafter, referred to as MCP.

The semiconductor device using the CoC technology, hereinafter, referred to as a CoC semiconductor device, includes a plurality of wired-connected or direct-bonded semiconductor chips. The direct-bond will hereinafter be referred to as flip chip bonding).

The CoC semiconductor device having a plurality of stacked semiconductor chips has an increased thickness. Particularly, it is preferable that a small-sized semiconductor device is integrated in a mobile device such as a mobile phone. In recent years, the requirement for higher density integration or packaging has been on the increase. Increasing the number of stacked semiconductor chips in the semiconductor device increases the total thickness of the semiconductor device, thereby making it difficult to realize the higher density packaging.

If the thickness of individual semiconductor chip is reduced in order to reduce the total thickness of the CoC semiconductor device, this will increase a stress such as a thermal stress due to difference in thermal expansion between sealing resin and the semiconductor chip. The thermal stress is caused by a thermal treatment process. The thermal stress causes a bend of the semiconductor chip so that the side portion of the semiconductor chip slightly rises up and the sectioned shape of the semiconductor chip is concave. Such bend will be called to as "concave-bend". In particular, the thermal stress is intensively applied to a position which is farthest from the substrate among the stacked semiconductor chips. This position will, hereinafter, be referred to as a top position. The largest concave-bend is generated in the top semiconductor chip which is positioned at the top position of the stack. The concave-bending will cause cracks in the semiconductor chips or the substrate.

Examples of countermeasure technique against these bending problems of the semiconductor chips are disclosed in Japanese Unexamined Patent Application, First Publications, Nos. JP-A-2006-269861, and JP-A-2007-066932.

Japanese Unexamined Patent Application, First Publications, Nos. JP-A-2006-269861 and JP-A-2007-066932 each relate to a semiconductor device and a method of forming the same. Each publication discloses a CoC semiconductor device which includes a lower substrate or a wiring board, in which a predetermined wiring is formed. The CoC semiconductor device further includes semiconductor chips which are electrically connected to the lower substrate. The CoC semiconductor device further includes an intermediate member, or a sealing member, which seals the semiconductor chips. The CoC semiconductor device further includes an upper plate which is disposed over the semiconductor chips. The thermal expansion rates of the upper plate and the lower substrate are approximately the same. By using the upper plate and the lower substrate having approximately the same thermal expansion rate, the bending of the semiconductor chip can be reduced.

The semiconductor devices disclosed in Japanese Unexamined Patent Application, First Publications, Nos. JP-A-2006-269861 and JP-A-2007-066932 are engaged with the following problems. Since the upper plate is arranged in an upper position which is distant from the stacked semiconductor chips, the thickness of the semiconductor device is increased. Since the upper plate is bonded only to the intermediate member, the intermediate member can easily be removed due to mechanical stress or mechanical shock. In addition, since the stacked semiconductor chips are sealed only by molding, voids will be generated between the semiconductor chips, to thereby lower the reliability of the semiconductor device.

Examples of structures which reinforce the CoC semiconductor device are disclosed in Japanese Unexamined Patent Application, First Publications, Nos. JP-A-2006-319243, JP-A-2007-194444, JP-A-2008-294367, and JP-A-2004-165283.

Japanese Unexamined Patent Application, First Publication, No. JP-A-2006-319243 discloses a memory module and a method of forming the same. The memory module includes a memory core chip, an interface chip and an interposer chip. A radiator plate is provided in the vicinity of the interface chip.

Japanese Unexamined Patent Application, First Publication, No. JP-A-2007-194444 discloses a stacked semiconductor device. The stacked semiconductor device includes a first semiconductor chip and a second semiconductor chip, and a connector which connects the first semiconductor chip and the second semiconductor chip.

Japanese Unexamined Patent Application, First Publication, No. JP-A-2008-294367 discloses a semiconductor device and a method of forming the same. The semiconductor device includes a substrate, a stacked structure which includes a plurality of semiconductor chips which are arranged on the substrate, and a reinforcement chip. The reinforcement chip is provided on a surface of the stacked structure which is opposite to the substrate or between the substrate and the stacked structure.

Japanese Unexamined Patent Application, First Publication, No. JP-A-2004-165283 discloses a semiconductor device. The semiconductor device includes a first semiconductor chip, a second semiconductor chip which is mounted on a first main surface of the first semiconductor chip, and a wiring board. The first semiconductor chip is mounted on the wiring board so that a second main surface of the first semiconductor chip is directed to the wiring board.

It is difficult for the above-described structures to suppress that the semiconductor chip from is concave-bent by thermal stress in the manufacturing process, and it is difficult to form a thickness-reduced semiconductor device.

SUMMARY

In one embodiment, a semiconductor device may include, but is not limited to, a chip stacked structure. The chip stacked structure may include, but is not limited to, first and second semiconductor chips. The first semiconductor chip has a first thickness. The second semiconductor chip has a second thickness that is thinner than the first thickness.

In another embodiment, a semiconductor device may include, but is not limited to, a wiring board, and a chip stacked structure. The chip stacked structure may be disposed over the wiring board. The chip stacked structure may include, but is not limited to, a plurality of semiconductor chips. A first one of the plurality of semiconductor chips is more distant from the wiring board than other of the plurality of semiconductor chips. The first one of the plurality of semiconductor chips is thicker than the other of the plurality of semiconductor chips.

In still another embodiment, a semiconductor device may include, but is not limited to, a wiring board, a supporting substrate, and a chip stacked structure. The chip stacked structure may be disposed between the wiring board and the supporting substrate. The chip stacked structure may include, but is not limited to, a plurality of semiconductor chips. A first one of the plurality of semiconductor chips is more distant from the supporting substrate than other of the plurality of semiconductor chips. The first one of the plurality of semiconductor chips is thicker than the other of the plurality of semiconductor chips.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
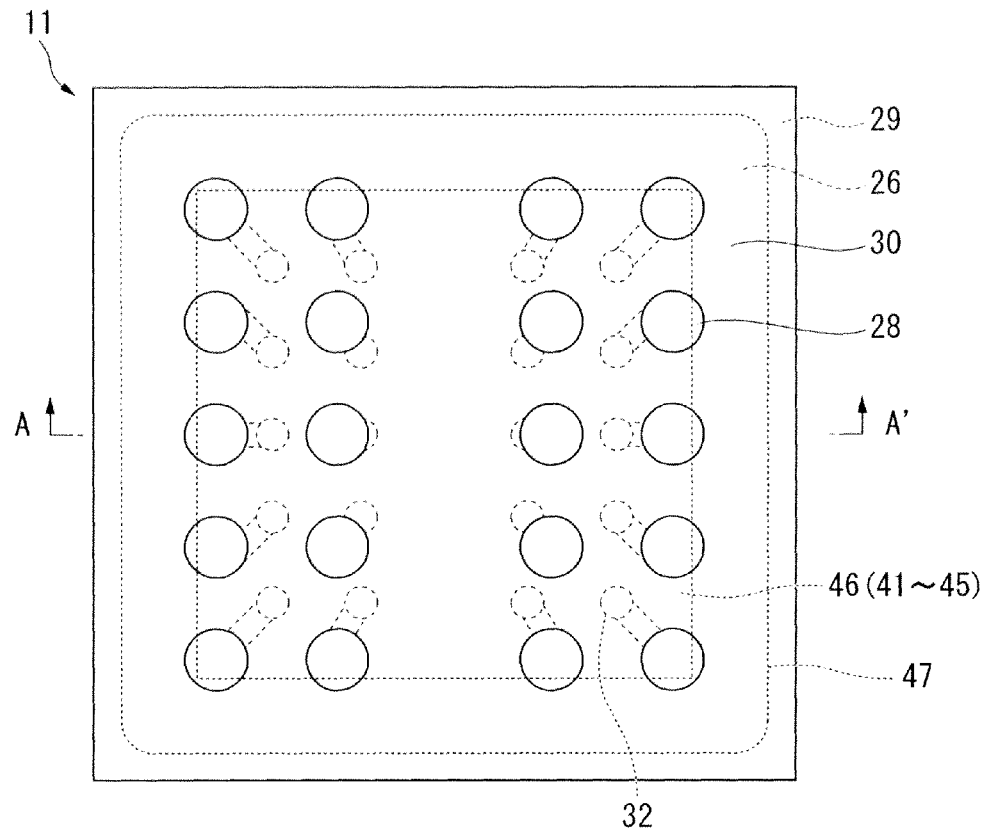
FIG. 1 is a bottom view illustrating a semiconductor device according to the first embodiment of the invention.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, a chip stacked structure. The chip stacked structure may include, but is not limited to, first and second semiconductor chips. The first semiconductor chip has a first thickness. The second semiconductor chip has a second thickness that is thinner than the first thickness.

In some cases, the first semiconductor chip may have a first circuit formation surface that faces toward the second semiconductor chip.

In some cases, the semiconductor device may further include a wiring board, on which the chip stacked structure is provided. The second semiconductor chip is disposed between the wiring board and the first semiconductor chip.

In some cases, the semiconductor device may further include a wiring board electrically connected to the chip stacked structure; and a supporting substrate that supports the chip stacked structure. The chip stacked structure is disposed between the wiring board and the supporting substrate. The first semiconductor chip is closest to the wiring board. The second semiconductor chip is closest to the supporting substrate. The second semiconductor chip is supported by the supporting substrate.

In some cases, the first thickness may be greater than 1.5 times of the second thickness.

In some cases, the first semiconductor chip may have a first through electrode, and first and second bonding pads. The first and second bonding pads are electrically connected to each other through the first through electrode. The second semiconductor chip may have a second through electrode, and third and fourth bonding pads. The third and fourth bonding pads are electrically connected to each other through the second through electrode. The second pad and the third pad are bonded to each other.

In some cases, the chip stacked structure may further include a third semiconductor chip between the first semiconductor chip and the second semiconductor chip. The third semiconductor chip may have a third thickness thinner than the first thickness. The first semiconductor chip may have a first circuit formation surface that faces toward the third semiconductor chip. The second semiconductor chip may have a second circuit formation surface that faces toward the third semiconductor chip. The third semiconductor chip may have a third circuit formation surface that faces toward the second semiconductor chip. In some cases, the semiconductor device may further include, but is not limited to, a wiring board on which the chip stacked structure is provided. The first semiconductor chip is more distant from the wiring board than the second semiconductor chip, and the second semiconductor chip is closest to the wiring board. In some cases, the semiconductor device may further include, but is not limited to, a wiring board on which the chip stacked structure is provided, and a supporting substrate that supports the chip stacked structure. The first semiconductor chip is closest to the wiring board. The second semiconductor chip is closest to the supporting substrate. The first semiconductor chip has a first circuit formation surface that faces toward the third semiconductor chip. The second semiconductor chip has a second circuit formation surface that faces toward the supporting substrate. The third semiconductor chip has a third circuit formation surface that faces toward the second semiconductor chip.

In some cases, the semiconductor device may further include a first sealing material that seals the chip stacked structure. The semiconductor device may furthermore include a second sealing material that covers the first sealing material.

In another embodiment, a semiconductor device may include, but is not limited to, a wiring board, and a chip stacked structure. The chip stacked structure may be disposed over the wiring board. The chip stacked structure may include, but is not limited to, a plurality of semiconductor chips. A first one of the plurality of semiconductor chips is more distant from the wiring board than other of the plurality of semiconductor chips. The first one of the plurality of semiconductor chips is thicker than the other of the plurality of semiconductor chips.

In some cases, the first one of the plurality of semiconductor chips may have a first circuit formation surface that faces toward the other of the plurality of semiconductor chips.

In some cases, the first circuit formation surface may be electrically connected through the other of the plurality of semiconductor chips to the wiring board.

In still another embodiment, a semiconductor device may include, but is not limited to, a wiring board, a supporting substrate, and a chip stacked structure. The chip stacked structure may be disposed between the wiring board and the supporting substrate. The chip stacked structure may include, but is not limited to, a plurality of semiconductor chips. A first one of the plurality of semiconductor chips is more distant from the supporting substrate than other of the plurality of semiconductor chips. The first one of the plurality of semiconductor chips is thicker than the other of the plurality of semiconductor chips.

In some cases, the first one of the plurality of semiconductor chips may have a first circuit formation surface that faces toward the other of the plurality of semiconductor chips.

In some cases, the plurality of semiconductor chips may be electrically connected to each other, and electrically connected to the wiring board.

In some cases, the chip stacked structure may be adhered to the supporting substrate.

In yet another embodiment, a method of forming a semiconductor device may include, but is not limited to, the following processes. A first semiconductor chip is stacked over a second semiconductor chip disposed over a wiring board. The first semiconductor chip has a first thickness. The second semiconductor chip has a second thickness that is thinner than the first thickness. A first sealing member is formed which seals the first and second semiconductor chips.

In some cases, the method may further include, but is not limited to, forming a second sealing member that covers the first sealing member.

In some cases, the wiring board may have a plurality of chip mounting sections.

In some cases, the method may further include, but is not limited to, stacking a third semiconductor chip over a fourth semiconductor chip disposed over a different one of the chip mounting sections of the wiring board from the chip mounting section, on which the second semiconductor chip is disposed. The first sealing member is formed, which seals the first, second, third and fourth semiconductor chips.

In some cases, the method may further include, but is not limited to, dicing the wiring board into the plurality of chip mounting sections, after forming the second sealing member.

In some cases, the first semiconductor chip may be stacked so that the first semiconductor chip has a first circuit formation surface that faces toward the second semiconductor chip.

In further another embodiment, a method of forming a semiconductor device may include, but is not limited to, stacking a first semiconductor chip over a second semiconductor chip disposed over a supporting substrate. The first semiconductor chip has a first thickness. The second semiconductor chip may have a second thickness that is thinner than the first thickness. The method may include, but is not limited to, forming a first sealing member that seals the first and second semiconductor chips. The method may include, but is not limited to, bonding a first wiring board to the first semiconductor chip.

In some cases, the method may further include, but is not limited to, forming a second sealing member that covers the first sealing member before bonding the first wiring board to the first semiconductor chip.

In some cases, the supporting substrate may have a plurality of chip mounting sections.

In some cases, the method may further include, but is not limited to, stacking a third semiconductor chip over a fourth semiconductor chip disposed over a different one of the chip mounting sections of the supporting substrate from the chip mounting section, on which the second semiconductor chip is disposed. The method may further include, but is not limited to, bonding a second wiring board to the third semiconductor chip after forming the first sealing member. The first sealing member is formed, which seals the first, second, third and fourth semiconductor chips.

In some cases, the method may further include, but is not limited to, dicing the supporting substrate into the plurality of chip mounting sections, after forming the second sealing member.

In some cases, the first semiconductor chip may be stacked so that the first semiconductor chip has a first circuit formation surface that faces toward the second semiconductor chip.

Embodiments of the present invention will be described.

First Embodiment

Semiconductor Device:

A semiconductor device according to a first embodiment of the present invention will be described.

Figure 2:
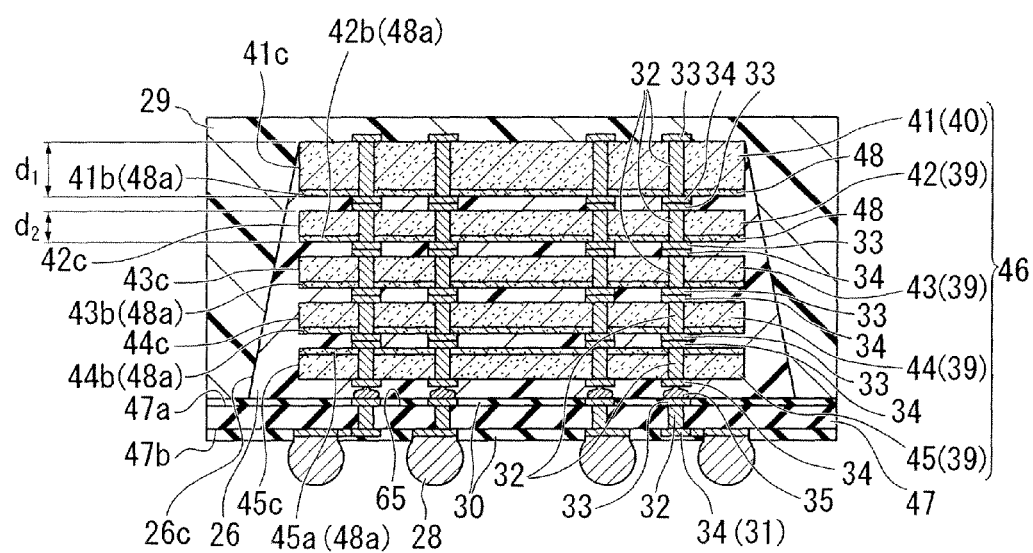
FIG. 2 is a cross sectional view illustrating a semiconductor device, taken along line A-A' in FIG. 1.

FIG. 1 is a bottom view illustrating a semiconductor device according to the first embodiment of the invention. FIG. 2 is a cross sectional view illustrating the semiconductor device, taken along line A-A' in FIG. 1.

As shown in FIG. 1, a semiconductor device 11 according to the embodiment of the invention may include, but is not limited to, a wiring board 47 and an insulating film on the wiring board 47. The wiring board 47 may have, but is not limited to, a rectangular shape in plan view. The semiconductor device 11 may have, but is not limited to, a matrix array of external terminals 28 on the insulating layer 30. The external terminals 28 may be, but is not limited to, a ball-shaped terminal.

Semiconductor chips 41, 42, 43, 44 and 45 may each have a rectangular shape in plan view. The semiconductor chips 41, 42, 43, 44 and 45 may be stacked over the wiring board 47. The surfaces of the wiring board 47 may be coated by the insulating films 30. The semiconductor chips 41 to 45 may each have a matrix array of penetration electrodes 32. Each penetration electrode 32 may have a circular shape in plan view. The stack of the semiconductor chips 41, 42, 43, 44 and 45 may have a matrix array of series connections of the penetration electrodes 32. Each series connection of the penetration electrodes 32 may be connected to the external terminal 28. The semiconductor chips 41 to 45 may be surrounded by a first sealing member 26 and a second sealing member 29. The first sealing member 26 may cover directly the stack of the semiconductor chips 41 to 45. The second sealing member 29 may cover the first sealing member 26, so that the second sealing member 29 coats the stack of the semiconductor chips 41 to 45 indirectly.

As shown in FIG. 2, the semiconductor device 11 according to the embodiment may include, but is not limited to, the wiring board 47 and a chip stacked structure 46 of the semiconductor chips 41 to 45. The chip stacked structure 46 may be covered with the first sealing member 26. The first sealing member 26 may be covered with the second sealing member 29.

In the chip stacked structure 46, the semiconductor chips 45 to 41 may sequentially be stacked on a surface 47a of the wiring board 47. Accordingly, the semiconductor device 11 according to the embodiment may be, but is not limited to, a chip on chip semiconductor device, hereinafter, referred to as a CoC semiconductor device.

As shown in FIG. 2, a side surface of the chip stacked structure 46 may be covered with the first sealing member 26. The first sealing member 26 may have, but is not limited to, a trapezoidal shape in vertical sectional view. The wiring board 47 may perform as a base for the chip stacked structure 46. The side surface 26c of the first sealing member 26 may be sloped and not vertical.

The second sealing member 29 may over the first sealing member 26 and the chip stacked structure 46, so that the chip stacked structure 46 is securely fixed to the wiring board 47.

The followings are detailed descriptions of each structural element of the semiconductor device.

Wiring Board:

The wiring board 47 may optionally be a plate member which is made of an insulating material. The wiring board 47 may have, but is not limited to, a rectangular shape in plan view. The wiring board 47 may, for example, be a flexible substrate, or a glass epoxy substrate which is formed of a polyimide base material.

The wiring board 47 may have the penetration electrodes 32 which penetrate from one side to the other side. The wiring board 47 may have bonding pads 33 and bonding pads 34 which are connected to the penetration electrodes 32 at one surface side and the other surface side thereof, respectively. A predetermined wiring may optionally be formed on opposite sides of the wiring board 47. As shown in FIG. 2, the wiring may be covered with the insulating film 30 such as a solder resist. Each of the bonding pads 34 on the insulating film 30 may be, but is not limited to, a land 31. The external terminal 28 which has a circular shape in vertical sectional view may be connected thereto. The lands 31 may have an interval of, for example but not limited to, 0.8 mm, and are arranged on the wiring board 47 in a lattice pattern in plan view. The thickness of the wiring board 47 is not particularly limited, but may be, for example, 100 µm.

Chip Stacked Structure:

As shown in FIG. 2, the chip stacked structure 46 is formed by sequentially stacking the semiconductor chips 45 to 41 over the surface 47a of the wiring board 47.

Semiconductor Chips:

A circuit layer 48 may be formed on a surface 41b of the semiconductor chip 41. Another circuit layer 48 may be formed on a surface 42b of the semiconductor chip 42. Still another circuit layer 48 may be formed on a surface 43b of the semiconductor chip 43. Another circuit layer 48 may be formed on a surface 44b of the semiconductor chip 44. Another circuit layer 48 may be formed on a surface 45a of the semiconductor chip 45. The circuit layer 48 provides a circuit formation surface 48a on which circuits are formed.

In some cases, dynamic Random Access Memory (hereinafter, referred to as DRAM) circuits may be formed on the circuit layers 48 of the semiconductor chips 41 to 44. Accordingly, the semiconductor chips 41 to 44 may be DRAM core chips which are used for storing information.

Further, an interface circuit (hereinafter, referred to as IF circuit) may be formed on the circuit layer 48 of the semiconductor chip 45 so that the semiconductor chip 45 can perform as an IF chip which is used for controlling input and output of data of the semiconductor chips 41 to 44.

The semiconductor chip 45 is stacked face-up over the wiring board 47. The semiconductor chips 41 to 44 are stacked face-down over the semiconductor chip 45 so that the circuit formation surfaces 48a are directed toward the wiring board 47. Thus, a semiconductor chip having a single circuit layer 48 may be prepared as the DRAM core chip. Since it is not necessary to prepare a mirror chip in which bump electrodes are reversely arranged as a DRAM core chip, manufacturing costs of the semiconductor device can be reduced.

The semiconductor chip 45 which is the IF chip can be disposed so that the circuit formation surfaces 48a are faced up and are directed opposite to the wiring board 47.

The semiconductor chips 41 to 45 may each have the penetration electrodes 32 which penetrate from one surface side to the other surface side. The semiconductor chips 41 to 45 may each have the bonding pads 33 and the bonding pads 34 which are connected to the penetration electrodes 32 at one surface side and the other surface side thereof, respectively.

The semiconductor chips 41 to 45 may be spaced from each other. The bonding pads 33 of one surface side and the bonding pads 34 of the other surface side are connected to each other and stacked between the semiconductor chips 41 to 45.

In addition, the semiconductor chip 45 and the wiring board 47 may be spaced from each other. The bonding pads 33 of one surface side of the wiring board 47 may be connected to the bonding pads 34 of the other surface side of the semiconductor chip 45 through wire stand bumps 35. The wire stand bumps 35 will, hereinafter, be referred to as wire bumps 35. The wire stand bumps 35 may be made of Au. The external terminal 28 may have a circular shape in vertical sectional view. The external terminal 28 may be connected on the land 31 of the wiring board 47.

The bonding pads 33 of one surface side of the wiring board 47 may be connected to the bonding pads 34 of the other surface side of the first semiconductor chip 45 through the wire bumps 35. The bonding pads 33 of one surface side of the first semiconductor chip 45 may be connected to the bonding pads 34 of the other surface side of the second semiconductor chip 44. The bonding pads 33 of one surface side of the second semiconductor chip 44 may be connected to the bonding pads 34 of the other surface side of the third semiconductor chip 43. The bonding pads 33 of one surface side of the third semiconductor chip 43 may be connected to the bonding pads 34 of the other surface side of the fourth semiconductor chip 42. The bonding pads 33 of one surface side of the fourth semiconductor chop 42 may be connected to the bonding pads 34 of the other surface side of the fifth semiconductor chip 41.

The wire bumps 35 may be, but are not limited to, solder bumps.

As described above, the bonding pads 33 of one surface side of each of the semiconductor chips 41 to 45 may be connected to the bonding pads 34 of the other surface side thereof. Conduction can be secured from the external terminal 28 which is connected to the bonding pads 34 (lands 31) of the other surface side of the wiring board 47 to the bonding pads 33 of one surface side of the fifth semiconductor chip 41.

As shown in FIG. 2, the chip stacked structure 46 may include, but is not limited to, the semiconductor chips 42 to 45, and the semiconductor chip 41. The semiconductor chip 41 may have a thickness larger than those of the semiconductor chips 42 to 45. The semiconductor chips 42 to 45 are referred to as thin semiconductor chips 39. The semiconductor chip 41 is referred to as thick semiconductor chip 40.

The thickness $d_2$ of the thin semiconductor chips 39 may preferably be smaller than that of a semiconductor chip of a single chip type in the related art. The thickness $d_2$ of the thin semiconductor chips 39 may, for example, be in the range of 30 μm to 50 μm.

The thickness $d_1$ of the thick semiconductor chip 40 may preferably be larger than the thickness $d_2$ of each thin semiconductor chip 39, and more preferably exceeds one-and-half times of the thickness $d_2$ of each thin semiconductor chip 39.

The thick semiconductor chip 40 may be disposed opposite to the wiring board 47 in the chip stacked structure 46. The chip stacked structure 46 which is opposite to the wiring board 47 may be positioned at a position to which the maximum thermal stress is applied when the first sealing member 26 is thermally cured and contracted. Accordingly, the thick semiconductor chip 40 may be disposed in this position. A bending resistance characteristic against bending due to the thermal stress of the chip stacked structure 46 is improved to thereby prevent the semiconductor chips 41 to 45 from being cracked.

The circuit formation surface 48a of the thick semiconductor chip 40 is directed to the thin semiconductor chips 39. Thus, a contracting force to contract the circuit formation surface 48a (hereinafter, bending force) will be generated in the thick semiconductor chip 40 when the thermal stress is applied thereto. The concave-bend due to the thermal stress of the first sealing member 26 is reduced. Even though the thickness of the semiconductor device 11 is reduced, cracks in the semiconductor chips 41 to 45 can be prevented.

The number of the semiconductor chips which form the chip stacked structure 46 is not particularly limited, and may be 2 or more. The configuration of the semiconductor chips is not limited to the four memory core chips and the single IF chip as described in this embodiment. The configuration of the semiconductor chips may include any combinations of semiconductor chips having any function such as a combination of a memory chip and a logic chip.

First Sealing Member:

As shown in FIG. 2, the first sealing member 26 fills gaps between the semiconductor chips 41 to 45. The first sealing member 26 covers side surfaces 41c, 42c, 43c, 44c and 45c of the semiconductor chips 41 to 45.

Forming the first sealing member 26 to fill the gaps between the semiconductor chips 41 to 45 can protect bonding sections of the bonding pads 33 of one surface side and the bonding pads 34 of the other surface side which are connected to each other, between the semiconductor chips 41 to 45. The bonding sections will, hereinafter, be referred to as electric bonding sections.

The first sealing member 26 may have, but is not limited to, a trapezoidal shape in vertical sectional view. The side of the wiring board 47 performs as a base. The side surface 26c of the first sealing member 26 is an inclined surface. The first sealing member 26 has the trapezoidal shape in vertical sectional view in which the side of the wiring board 47 becomes the lower base. Adhesion between the first sealing member 26 and the wiring board 47 is enhanced to prevent removal of the wiring board 47. The surface 47a of the wiring board 47 is shaped with a pear-skin finish. Adhesion between the wiring board 47 and the first sealing member 26 can be further enhanced.

As the first sealing member 26, for example, underfill material may be used.

Second Sealing Member:

As shown in FIG. 2, the second sealing member 29 may cover the first sealing member 26 and the chip stacked structure 46. Thus, the chip stacked structure 46 may securely fixed to the wiring board 47. Removal of the wiring board 47 from the chip stacked structure 46 can be suppressed.

As the second sealing member 29, for example, sealing resins such as epoxy resin may be used.

Wiring Board Before Cutting:

The following descriptions will be directed to a wiring board before cutting which is used in a method of forming a semiconductor device according to an embodiment of the invention.

Figure 3:
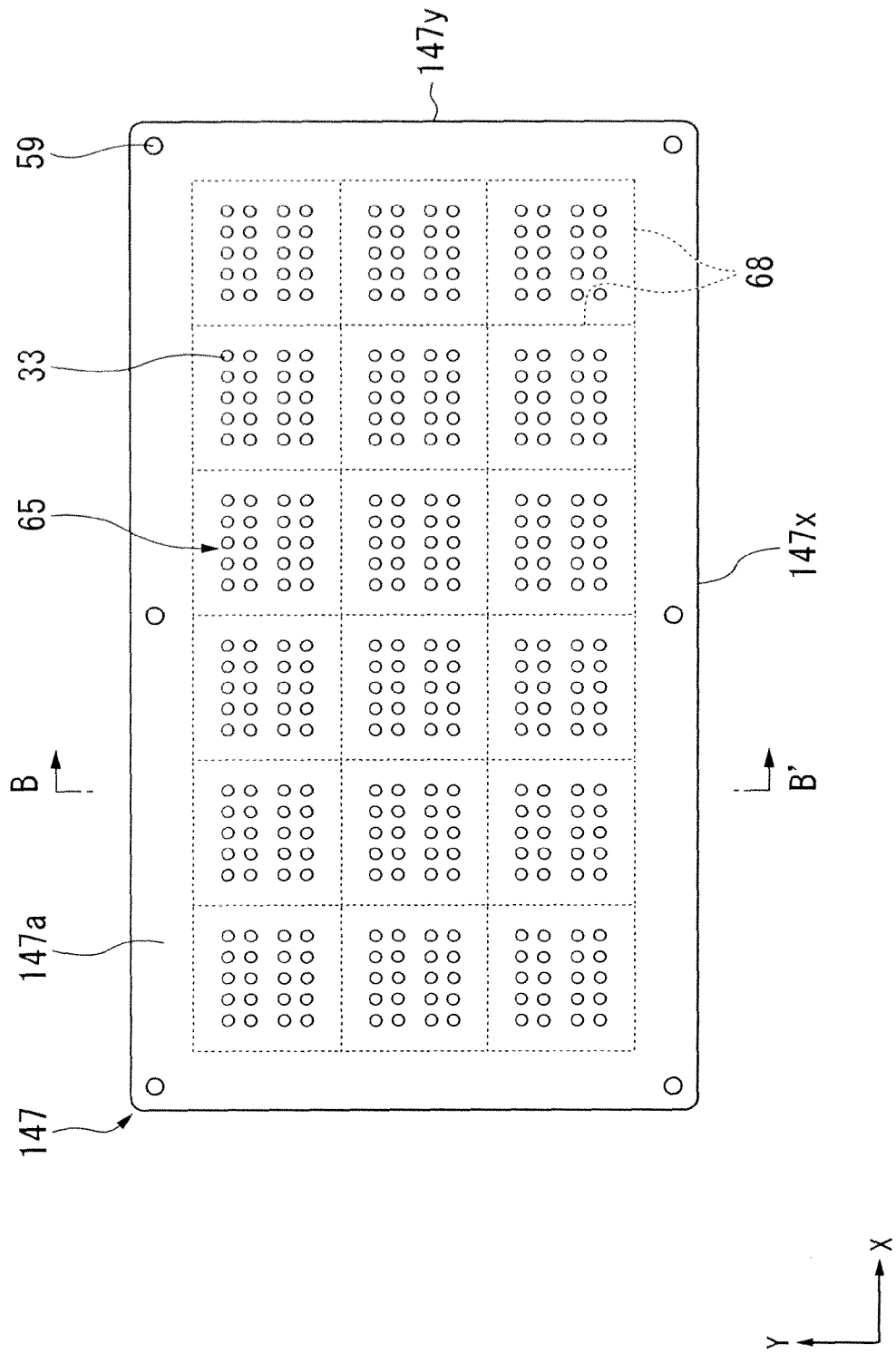
FIG. 3 is a plan view illustrating an example of a wiring board before cutting which is used in a method of forming the semiconductor device according to the embodiment of the invention.

FIG. 3 is a plan view illustrating an example of the wiring board before cutting which is used in the method of forming the semiconductor device according to the embodiment of the invention.

As shown in FIG. 3, a wiring board 147 may be a predecided wiring board which is to be diced in the later dicing process. The wiring board 147 is a rectangular shape and is processed by a mold array process (MAP) method. The wiring board 147 can be formed of a flexible substrate, or a glass epoxy substrate which is made of a polyimide base material. The direction which is parallel to a side 147y of the wiring board 147 shown in FIG. 3 is represented as a Y direction. The other direction which is parallel to the other side 147x is represented as an X direction. The X-direction is perpendicular to the Y-direction.

As shown in FIG. 3, one side 147a of the wiring board 147 has dicing lines 68. The dicing lines 68 run in the X direction and the Y direction to form a matrix array of rectangular shaped chip mounting sections 65 on which semiconductor chips are mounted. The dicing lines 68 run to draw a lattice pattern over the one side 147a of the wiring board 147. In the later dicing process, the wiring board 147 will be diced or cut along the dicing lines 68 so that the wiring board 147 is divided into the chip mounting sections 65. Each chip mounting section 65 may have a matrix array of the bonding pads 33 of a circular shape. By cutting along the dicing lines 68, the wiring board 147 becomes the wiring board 47.

Alignment holes 59 may be formed in an outer circumferential side of the wiring board 147. Due to the alignment holes 59, alignment can be correctly performed and the wiring board 147 can be easily transported.

Method of Forming Semiconductor Device:

A method of forming a semiconductor device according to an embodiment of the invention will be described with reference to FIGS. 4 to 11. FIGS. 4 to 10 are sectional views illustrating the semiconductor device taken along line B-B' in FIG. 3. FIG. 11 is a plan view illustrating the semiconductor device after the dicing process.

The method of forming the semiconductor device 11 according to the embodiment of the invention may include, but is not limited to, a process in which one or more thin semiconductor chips are stacked over a substrate. Then, a thick semiconductor chip is stacked on the thin semiconductor chips so that the circuit formation surface 48a of the thick semiconductor chip is directed to the thin semiconductor chips, hereinafter, referred to as stacking process. The first sealing member is formed so that the first sealing member covers the side surfaces of the semiconductor chips. Then, the second sealing member is formed so that the second sealing member covers the first sealing member, hereinafter, referred to as sealing process.

Stacking Process:

An Au wire may be thermally pressure-bonded with ultrasonic waves on each bonding pad 33 of the wiring board 147, using a known bonding apparatus. An end of the Au wire is drawn and cut using a wire stand bump method, to thereby form the wire bumps 35.

The thick semiconductor chip 40 may be prepared as the semiconductor chip 41 of the DRAM core chip.

Then, the semiconductor chips 42 to 44 of the DRAM core chips and the semiconductor chip 45 of the IF chip may be prepared. Back surfaces of the semiconductor chips 42 to 44 and the semiconductor chip 45 may be polished by a known wafer back polishing apparatus to obtain a thin semiconductor chip 39.

Figure 4:
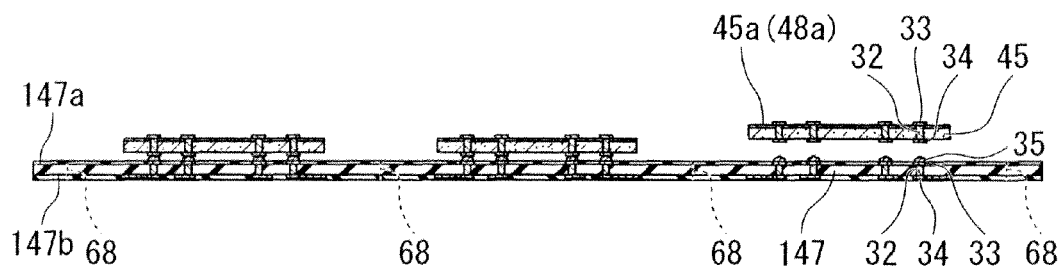
FIG. 4 is a cross sectional view illustrating a semiconductor device in a step involved in a method of forming the semiconductor device of FIGS. 1 and 2, in the first embodiment of the invention.

As shown in FIG. 4, the circuit formation surface 48a of the semiconductor chip 45 may be faced up so that the circuit formation surface 48a is directed opposite to the wiring board 147. The semiconductor chip 45 may be mounted on each chip mounting section 65 of the wiring board 147.

At this time, the bonding pads 33 of one surface side of the wiring board 147 and the bonding pads 34 of the other surface side of the semiconductor chip 45 may be connected to each other through the wire bumps 35 and may be temporarily fixed at a low temperature of about 150° C.

The circuit formation surface 48a of the semiconductor chip 44 may be faced down so that the circuit formation surface 48a is directed toward the wiring board 147. The semiconductor chip 44 may be mounted on the semiconductor chip 45.

At this time, the bonding pads 33 of one surface side of the semiconductor chip 45 and the bonding pads 34 of the other surface side of the semiconductor chip 44 may be connected to each other and may be temporarily fixed at a low temperature of about 150° C.

The circuit formation surface 48a of the semiconductor chip 43 may be faced down. The semiconductor chip 43 may be mounted on the semiconductor chip 44.

At this time, the bonding pads 33 of one surface side of the semiconductor chip 44 and the bonding pads 34 of the other surface side of the semiconductor chip 43 may be connected to each other and may be temporarily fixed at a low temperature of about 150° C.

Figure 5:
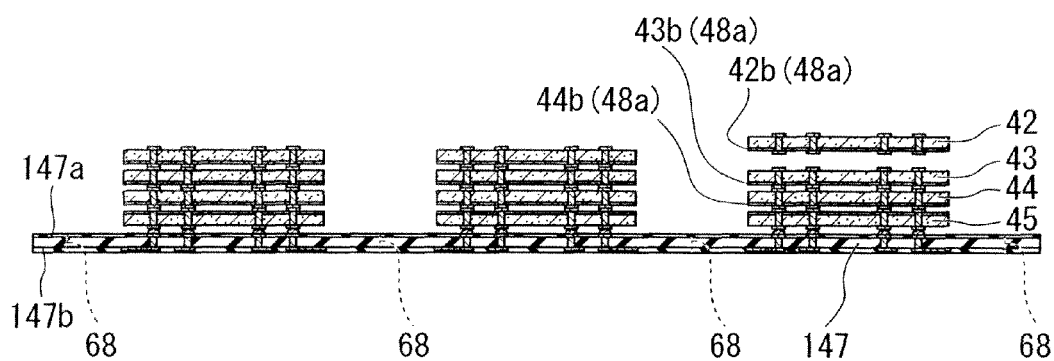
FIG. 5 is a cross sectional view illustrating a semiconductor device in a step subsequent to the step of FIG. 4, involved in the method of forming the semiconductor device of FIGS. 1 and 2, in the first embodiment of the invention.

As shown in FIG. 5, the circuit formation surface 48a of the semiconductor chip 42 may be faced down. The semiconductor chip 42 may be mounted on the semiconductor chip 43.

At this time, the bonding pads 33 of one surface side of the semiconductor chip 43 and the bonding pads 34 of the other surface side of the semiconductor chip 42 may be connected to each other and are temporarily fixed at a low temperature of about 150° C.

Figure 6:
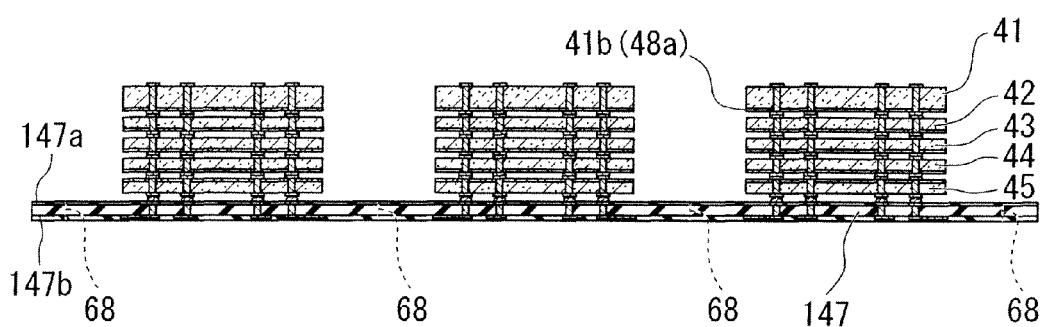
FIG. 6 is a cross sectional view illustrating a semiconductor device in a step subsequent to the step of FIG. 5, involved in the method of forming the semiconductor device of FIGS. 1 and 2, in the first embodiment of the invention.

As shown in FIG. 6, the circuit formation surface 48a of the semiconductor chip 41 may be faced down. The semiconductor chip 41 may be mounted on the semiconductor chip 42.

At this time, the bonding pads 33 of one surface side of the semiconductor chip 41 and the bonding pads 34 of the other surface side of the semiconductor chip 41 may be connected to each other and are temporarily fixed at low temperature of about 150° C.

In a high temperature state of about 300° C., a load will be applied to the semiconductor chips 41 to 45 toward the wiring board 147. Each bonding pads 33 of one surface side is pressure-bonded to a corresponding one of bonding pads 34 of the other surface side of the semiconductor chips 41 to 45. Accordingly, conduction is secured from the bonding pads 34 of the wiring board 147 to the bonding pads 33 of the fifth semiconductor chip 41. The chip stacked structure 46 may be formed by stacking the semiconductor chips 41 to 45.

When connecting the semiconductor chips 41 to 45 together, a load can be applied thereto and at the same time ultrasonic waves may be applied thereto. Thus, the reliability of bonding is improved. Further, the actual pressure-bonding process may be performed in each bonding stage.

Sealing Process:

The first sealing member 26 may be supplied in a drop-down method to the side surface of the chip stacked structure 46 which is formed on the wiring board 147. At this time, the first sealing member 26 fills gaps between the semiconductor chips 41 to 45 due to a capillary tube phenomenon and flows down toward the wiring board 147 due to gravity.

Figure 7:
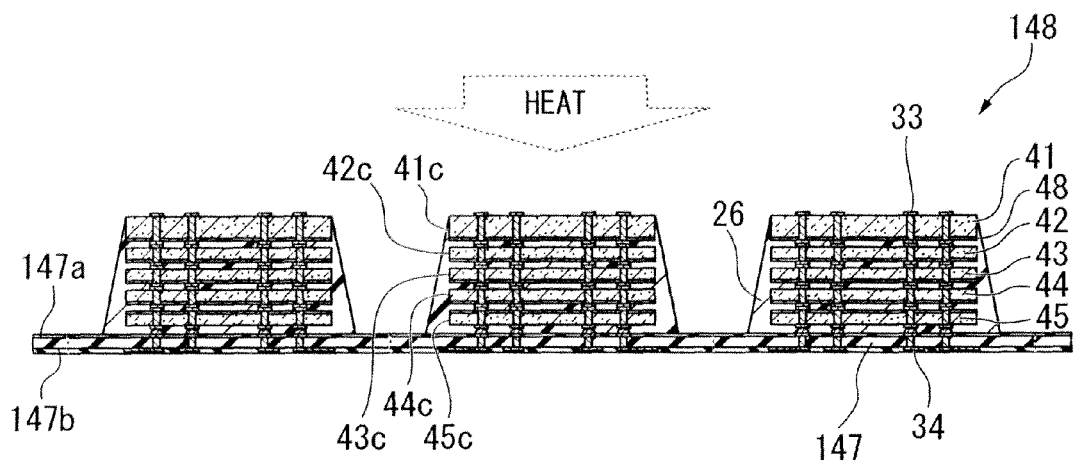
FIG. 7 is a cross sectional view illustrating a semiconductor device in a step subsequent to the step of FIG. 6, involved in the method of forming the semiconductor device of FIGS. 1 and 2, in the first embodiment of the invention.

As shown in FIG. 7, the first sealing member 26 may be cured by performing a thermal treatment process (curing) at about 150° C. Thus, the first sealing member 26 may be formed which covers the side surfaces 41c to 45c of the semiconductor chips 41 to 45. The first sealing member 26 may have a trapezoidal shape in vertical sectional view. The wiring board 147 may be a base. The side surface 26c of the first sealing member 26 may be an inclined surface.

In a cooling process after the thermal curing, thermal expansion and contraction of the first sealing member 26 is larger than that of the semiconductor chips 41 to 45. Thermal stress which causes concave bent is applied to the chip stacked structure 46 due to the first sealing member 26. In particular, the wiring board 147 is fixed by a jig not shown. Thermal stress to bend at the lowest position of the chip stacked structure 46 is suppressed. Thermal stress to cause the concave-bend is applied to the respective layers of the chip stacked structure 46. The strongest thermal stress of the concave-bend is applied to the uppermost semiconductor chip 41.

In this embodiment, the thick semiconductor chip 40 is used as the uppermost semiconductor chip 41. The thermal stress of the concave-bend can be suppressed. Crack of the semiconductor chips 41 to 45 can be prevented.

In the cooling process after the thermal curing, thermal expansion and contraction of an oxide film for forming the circuit formation surface 48a is larger than that of the semiconductor chips 41 to 45. Contraction thermal stress is applied to the circuit formation surface 48a.

In this embodiment, since the circuit formation surface 48a of the semiconductor chip 41 is arranged in the face down direction, thermal stress which is convex-bent is applied to the semiconductor chip 41. Due to the thermal stress which is convex-bent, the thermal stress which is concave-bent due to the thermal stress of the first sealing member 26 can be offset to thereby lessen the thermal stress.

The wiring board 147, in which the first sealing member 26 is formed, is arranged on a lower shaping mold (hereinafter, referred to as lower mold) 71 of a transfer mold apparatus so that the other surface 147b becomes a lower side.

An upper shaping mold 72, hereinafter, referred to as upper mold, of the transfer mold apparatus is arranged through a sheet 74 which is formed of elastic material. A cavity 73 is formed in the upper mold 72, and a plurality of chip stacked bodies 46 which are spaced from each other and arranged on the wiring board 147 may be surrounded in the cavity 73, in a batch. Further, a gate section 75 which connects the cavity 73 to the outside is provided in the upper mold 72.

Figure 8:
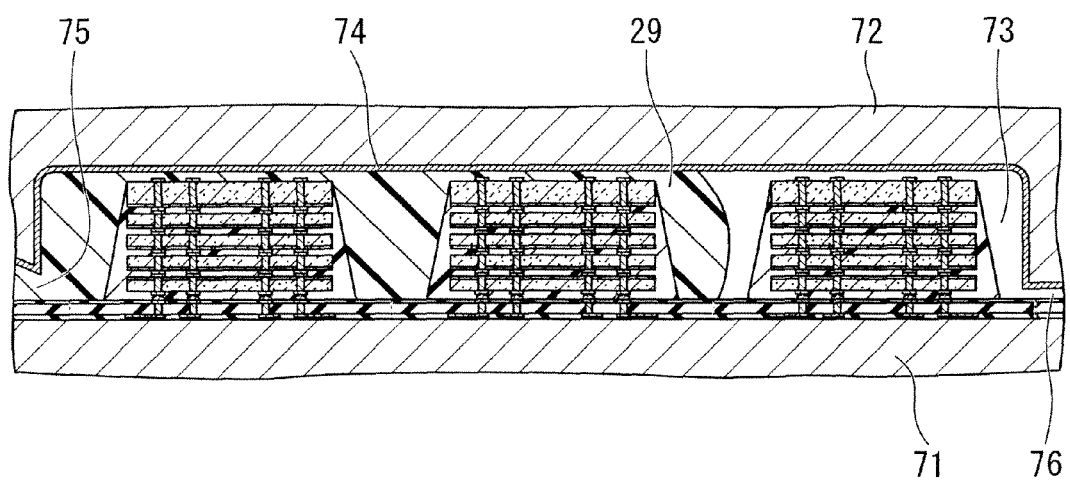
FIG. 8 is a cross sectional view illustrating a semiconductor device in a step subsequent to the step of FIG. 7, involved in the method of forming the semiconductor device of FIGS. 1 and 2, in the first embodiment of the invention.

As shown in FIG. 8, the second sealing member 29 which is made of sealing resin which is heated and molten inside of the cavity 73 is injected through the gate section 75 toward an air vent section 76.

The second sealing member 29 is cured under predetermined conditions. For example, in the case where thermal curing resin such as epoxy resin is used as the sealing resin, thermal treatment such as curing is performed at about 180° C. Then, baking is performed at a predetermined temperature, to thereby completely cure the second sealing member 29.

By closing the lower mold 71 and the upper mold 72 through the sheet 74 which is formed of elastic material, the sheet 74 can be adhered to the top surface sides of the chip stacked bodies 46. The second sealing member 29 can be prevented from being wrapped on the top surface sides of the chip stacked bodies 46. Thus, when removing the upper mold 72 and the sheet 74, the lands 30 on the top surface sides of the chip stacked bodies 46 may be in an exposed state.

In this embodiment, since the plurality of chip stacked bodies 46 is sealed in a batch after the periphery of the chip stacked structure 46 is sealed, voids between the semiconductor chips which are generated in a normal single curing process can be suppressed.

In this embodiment, the transfer mold apparatus is used for injection of the second sealing member 29, but a compression mold apparatus or a compression mold method may be used. By using the compression mold apparatus, the influence of the mold flowing accompanying the injection can be further reduced.

Ball Mounting Process:

The wiring board 147 in which the second sealing member 29 is formed is obtained by removing the upper mold 71 and the lower mold 72, and thus, the other surface side 147b thereof is arranged in an upper direction.

External terminals 28 which are made of conductive metallic balls such as solder balls are adsorbed and held in a plurality of adsorption holes not shown, which are formed in an installation surface 77b of a ball mounting tool 77 of a ball mounter not shown. The adsorption holes are formed to correspond to the arrangement of the plurality of lands 31. Existing ball grid array, hereinafter, referred to as BGA, assembly equipment may be used as the ball mounter.

Flux is transferred to the external terminals 28 which are made of the solder balls and which are adsorbed and held.

Figure 9:
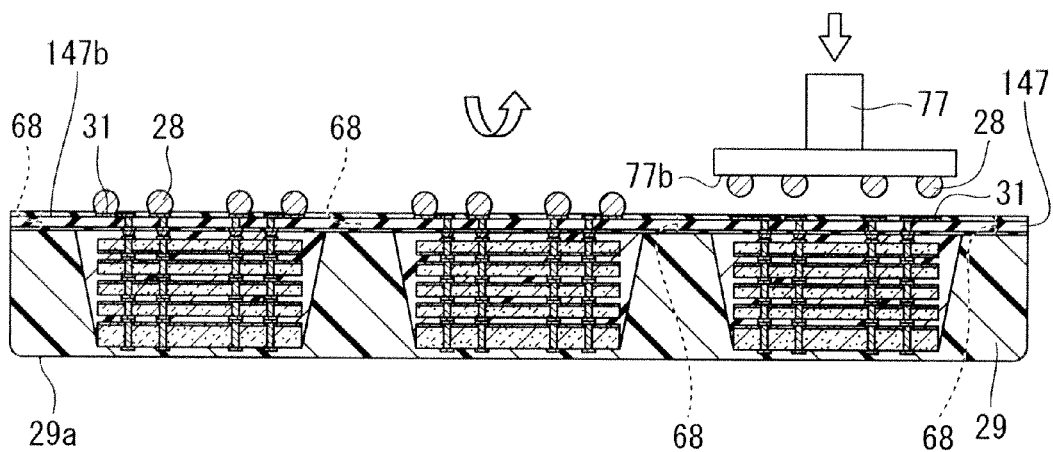
FIG. 9 is a cross sectional view illustrating a semiconductor device in a step subsequent to the step of FIG. 8, involved in the method of forming the semiconductor device of FIGS. 1 and 2, in the first embodiment of the invention.

As shown in FIG. 9, the external terminals 28 which are made of the solder balls are mounted on the lands 31 which are formed on the other surface 147b of the wiring board 147. The external terminals 28 are mounted on all the chip stacked bodies 46, and then, the wiring board 147 is heated and reflowed to fix the external terminals 28. Thus, the wiring board 147 is obtained in which the external terminals 28 are formed.

Dicing Process:

A dicing tape 79 is attached to one surface 29a of the second sealing member 29.

Figure 10:
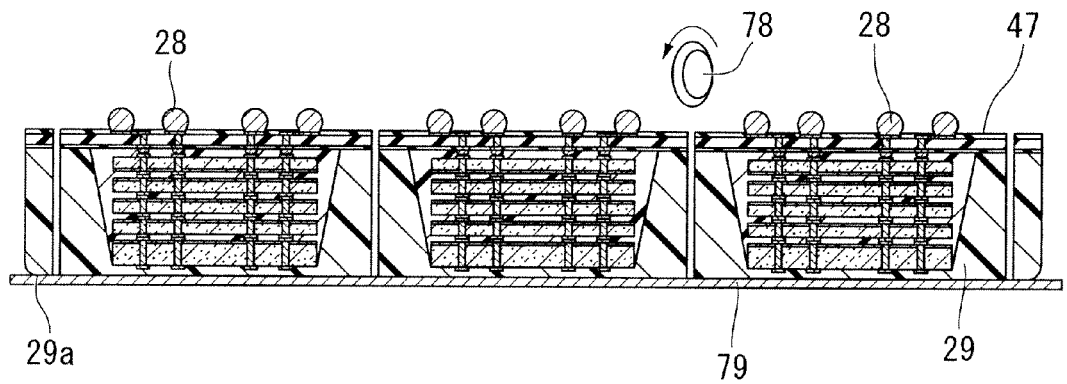
FIG. 10 is a cross sectional view illustrating a semiconductor device in a step subsequent to the step of FIG. 9, involved in the method of forming the semiconductor device of FIGS. 1 and 2, in the first embodiment of the invention.
Figure 11:
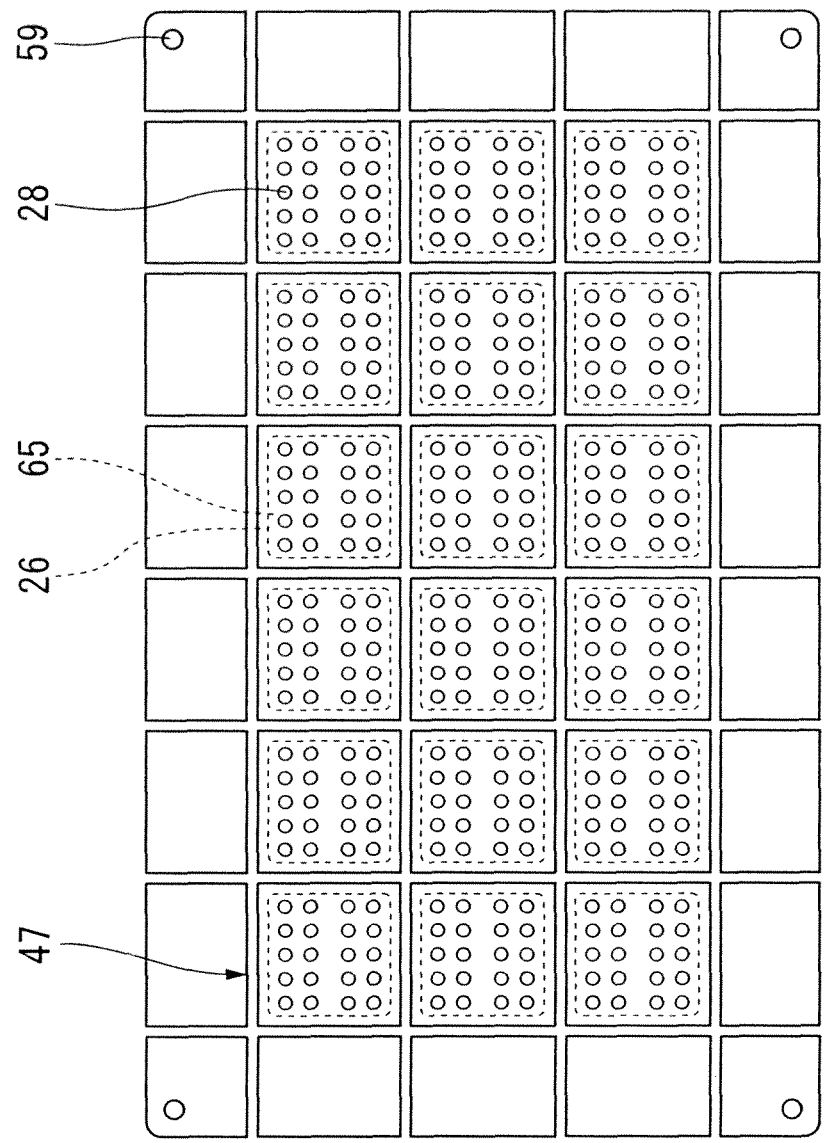
FIG. 11 is a plan view illustrating a semiconductor device in the step of FIG. 10, involved in the method of forming the semiconductor device of FIGS. 1 and 2, in the first embodiment of the invention.

As shown in FIGS. 10 and 11, the wiring board 147 is cut along the cutting marks 68 in longitudinal and transverse directions in a lattice pattern by a dicing blade 78 to obtain the wiring board 47.

The semiconductor device 11 according to an embodiment of the invention is obtained by being picked up from the dicing tape 79.

In this embodiment, the BGA semiconductor device has been described, but the invention may apply to other semiconductor devices such as LGA, land grid array. Further, in this embodiment, the DRAM core chip and the IF chip are used, but the invention may use a combination of semiconductor chips having different functions such as a memory chip and a logic chip. In addition, in this embodiment, the semiconductor chips are stacked in five layers, but the number of the stacked layers is not limited thereto.

The semiconductor device 11 according to the embodiment may include, but is not limited to, the wiring board 47, the chip stacked structure 46, the first sealing member 26, the second sealing member 29, and the external terminals 28. The chip stacked structure 46 is formed by stacking two or more semiconductor chips 41 to 45 which are stacked on one surface 47a of the wiring board 47. The first sealing member 26 is formed to cover the side surfaces 41c to 45c of the semiconductor chips 41 to 45. The second sealing member 29 is formed to cover the first sealing member 26. The external terminals 28 are formed on the other surface 47b of the wiring board 47. The chip stacked structure 46 may include the thin semiconductor chips 39, and the thick semiconductor chip 40 which is thicker than the thin semiconductor chips 39. A thin semiconductor device can be manufactured in high density by stacking the thin semiconductor chips 39. Even though the thickness of the semiconductor device is reduced, the concave-bend due to the thermal stress is suppressed by the thick semiconductor chip 40. A bending resistance characteristic against bend of the chip stacked structure 46 which is made of two or more semiconductor chips 41 to 45 is improved to thereby prevent cracks of the semiconductor chips 41 to 45. Thus, defective products can be prevented from being generated to thereby improve yield rates. Further, existing chip members or assembly equipments may be used. Manufacturing costs can be reduced.

In the semiconductor device 11 according to the embodiment, the circuit formation surface 48a of the thick semiconductor chip 40 is directed to the thin semiconductor chips 39. The concave-bend is reduced by a force, hereinafter referred to as bending force, to contract the circuit formation surface 48a of the thick semiconductor chip 40 which is generated when thermal stress is applied thereto. Accordingly, even though the thickness of the semiconductor device 11 is reduced, cracks in the semiconductor chips 41 to 45 can be prevented from being generated.

In the semiconductor device 11 according to the embodiment, the thick semiconductor chip 40 is arranged opposite to the wiring board 47 of the chip stacked structure 46. A bending resistance characteristic against bend of the semiconductor chip 41 in the highest position, to which load of the maximum thermal stress is applied, can be improved when the first sealing member 26 is thermally cured and contracted. Accordingly, even though the thickness of the semiconductor device is reduced, bend of the semiconductor chips 41 to 45 can be prevented from being generated and cracks of the semiconductor chips 41 to 45 can be prevented.

In the semiconductor device 11 according to the embodiment, the plate thickness $d_1$ of the thick semiconductor chip 40 exceeds 1.5 times of the plate thickness $d_2$ of the thin semiconductor chip 39. Even though the plate thickness of the thin semiconductor chip 39 is reduced to reduce the thickness of the semiconductor device 11, the thick semiconductor chip 40 can suppress the concave-bend due to the thermal stress to thereby reinforce a bending resistance characteristic against the bend of the chip stacked structure 46 which is formed by stacking two or more semiconductor chips 41 to 45. The semiconductor chips 41 to 45 can be prevented from being cracked.

In the semiconductor device 11 according to the embodiment, each of the semiconductor chips 41 to 45 includes the penetration electrodes 32 which penetrate from one surface side to the other surface side, and the bonding pads 33 of one surface side and the bonding pads 34 of the other surface side which are connected to the penetration electrodes 32. The bonding pads 33 of the one surface side and the bonding pads 34 of the other surface side are connected to each other and stacked between the respective semiconductor chips 41 to 45. Conduction can be achieved from the bonding pads 33 of one surface side of the semiconductor chip 41 to the bonding pads 34 of the other surface side of the semiconductor chip 45.

The method of forming the semiconductor device 11 according to the embodiment of the invention may include the stacking process. In the stacking process, one or more thin semiconductor chips 39 are stacked on the substrate. Then, the thick semiconductor chip 40 is stacked while the circuit formation surface 48a thereof is directed to the thin semiconductor chips 39. The first sealing member 26 is formed to cover the side surfaces 41c to 45c of the semiconductor chips 41 to 45. Then, the second sealing member 29 is formed to cover the first sealing member 26. The thick semiconductor chip 40 having the improved bending resistance characteristic against the bend is disposed in the highest position to which the maximum thermal stress is applied when the first sealing member 26 is thermally cured and contracted. The concave-bend due to the thermal stress is suppressed, thereby permitting easy manufacture of the thin semiconductor device.

In the method of forming the semiconductor device 11 according to the embodiment, the substrate is the wiring board 147 which is formed with two or more chip stacked bodies 65 on which the semiconductor chips 41 to 45 are mounted. The dicing process by cutting the wiring board 147 after the sealing process to obtain the wiring board 47 is performed, even though the plate thickness of the thin semiconductor chip 39 is reduced to reduce the thickness of the semiconductor device. The concave-bend due to the thermal stress can be suppressed by the thick semiconductor chip 40 thereby preventing the bend of the chip stacked structure 46 which includes two or more semiconductor chips 41 to 45. This can prevent cracks of the semiconductor chips 41 to 45. The thin semiconductor device can be easily manufactured.

Second Embodiment

A second example of a semiconductor device according to a second embodiment of the invention will be described.

Figure 12:
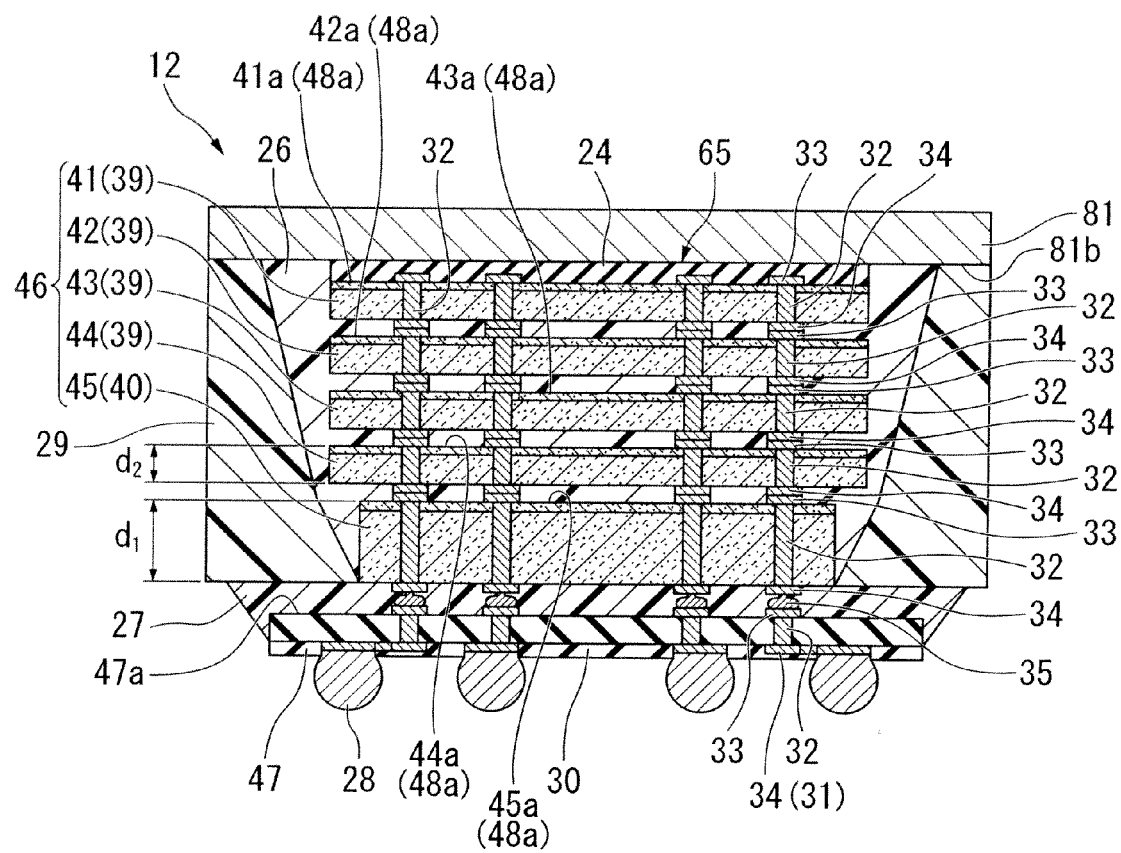
FIG. 12 is a cross sectional view illustrating a semiconductor device according to a second embodiment of the invention.

FIG. 12 is a sectional view illustrating an example of the semiconductor device according to the second embodiment of the invention.

As shown in FIG. 12, a semiconductor device 12 according to the embodiment has substantially the same configuration as in the first embodiment, except the following structures. A semiconductor chip 45 of a wiring board 47 may be a thick semiconductor chip 40. A semiconductor chip 41 may be a thin semiconductor chip 39. The width of a thick semiconductor chip 40 may be smaller than that of the thin semiconductor chip 39. A first sealing member 26 may be formed in a trapezoidal shape in vertical sectional view. The wiring board 47 may be the upper base side. A second adhesive member 27 may be arranged between a semiconductor chip 45 and the wiring board 47. A supporting substrate 81 may be arranged on a surface 41a of the semiconductor chip 41 through a first adhesive member 24. Circuit formation surfaces 48a of the semiconductor chips 41 to 44 may be directed toward the supporting substrate side. The circuit formation surfaces 48a are opposite to the wiring board 47. The same reference numbers are given to the same elements as in the first embodiment.

Supporting Substrate:

The supporting substrate 81 is a plate-shaped member which is made of metallic material. For example, high stiffness material such as alloy 42 which is an iron nickel alloy is preferably used as the metallic material. Accordingly, even though the thickness of the semiconductor device is reduced, bend of the semiconductor chips due to thermal stress can be prevented, and cracks of the semiconductor chips can be prevented.

The thickness of the supporting substrate 81 is not particularly limited, but may be, for example, 100 µm to 200 µm.

As the supporting substrate 81, material having high thermal radiation characteristics such as Cu may be used. Accordingly, a semiconductor device of high thermal radiation characteristics can be achieved.

First Adhesive Member:

A chip stacked structure 46 is adhered to the supporting substrate 81 by the first adhesive member 24. It is preferable to use high insulating material as the first adhesive member 24. By using the high insulating material, the semiconductor chip 41 and the supporting substrate 81 may be in an insulated state. Further, it is more preferable to use material having high thermal conductivity. Accordingly, heat from the chip stacked structure 46 is effectively transferred to the supporting substrate 81, to thereby improve thermal radiation characteristics of the semiconductor device.

As the first adhesive member 24, for example, a die attached film, hereinafter referred to as DAF, a non conductive paste, hereinafter, referred to as NCP, which is made by forming an adhesive layer on opposite sides of a polyimide base material can be used.

Chip Stacked Structure:

As shown in FIG. 12, the chip stacked structure 46 is formed by sequentially stacking the semiconductor chips 45 to 41 on a surface 47a of the wiring board 47.

To each of the semiconductor chips 41 to 45 are provided penetration electrodes 32 which penetrate from one surface side to the other surface side, and bonding pads 33 and bonding pads 34 which are connected to the penetration electrodes 32 at one surface side and the other surface side thereof, respectively. The semiconductor chips 41 to 45 are spaced from each other, and the bonding pads 33 of one surface side and the bonding pads 34 of the other surface side are connected to each other and stacked between the semiconductor chips 41 to 45.

In addition, the semiconductor chip 45 and the wiring board 47 are spaced from each other, and the bonding pads 33 of one surface side of the wiring board 47 are connected to the bonding pads 34 of the other surface side of the semiconductor chip 45 through wire bumps 35. Further, an external terminal 28 which has a circular shape in vertical sectional view is connected on each land 31 of the wiring board 47.

As described above, the bonding pads 33 of one surface side of each of the semiconductor chips 41 to 45 and the bonding pads 34 of the other surface side thereof are connected to each other, and thus, conduction from the external terminals 28 which are connected to the bonding pads 34 or lands 31 of the other surface side of the wiring board 47 to the bonding pads 33 of one surface side of the fifth semiconductor chip 41 can be secured.

DRAM circuits are formed on the circuit layers 48 of the semiconductor chips 41 to 44, and accordingly, the semiconductor chips 41 to 44 are DRAM core chips which are used for storing information. Further, an IF is formed on the circuit layer 48 of the semiconductor chip 45, the semiconductor chip 45 is an IF chip which is used for controlling input and output of data of the semiconductor chips 41 to 44.

The semiconductor chips 41 to 44 are stacked, while the circuit formation surfaces 48a are directed opposite to the wiring board 47. Thus, a semiconductor chip having a single circuit layer 48 may be prepared as the DRAM core chip. Since it is not necessary to prepare a mirror chip in which bump electrodes are reversely arranged as the DRAM core chip, the manufacturing costs of the semiconductor device may be reduced.

Further, the semiconductor chip 45 which is the IF chip is disposed while the circuit formation surface 48a is directed opposite to the wiring board 47.

As shown in FIG. 12, the width of the thick semiconductor chip 40 is smaller than the width of the thin semiconductor chip 39. That is, the area of the thick semiconductor chip 40 when seen from a planer view is smaller than that of the thin semiconductor chip 39. Thus, the bending resistance characteristic against bend due to thermal stress of the thick semiconductor chip 40 is improved to thereby prevent the semiconductor device 11 from being cracked.

Second Adhesive Member:

The wiring board 47 is fixedly adhered to the chip stacked structure 46 by a second adhesive member 27.

It is preferable to use insulating material as the second adhesive member 27. Accordingly, by making a gap between the semiconductor chip 45 and the wiring board 47 in an insulation state, electric contact sections which are formed of the bonding pads 33 of one surface side of the wiring board 47, the bonding pads 34 of the other surface side of the semiconductor chip 45, and the wire bumps 35 can be protected from mechanical and electrical damage.

Similar to the first bonding member 24, for example, NCP may be used as the second bonding member 27.

A method of forming a semiconductor device according to the embodiment of the invention will be described.

The method of forming the semiconductor device according to the embodiment is approximately the same as in the first embodiment, except for the following structures. The semiconductor chip 45 of the wiring board 47 is the thick semiconductor chip 40. The semiconductor chip 41 is the thin semiconductor chip 39. The width of the thick semiconductor 40 is smaller than that of the thin semiconductor chip 39. The first sealing member 26 is formed in a trapezoidal shape in vertical sectional view. The wiring board 47 is the upper base side. The second adhesive member 27 is arranged between the semiconductor chip 45 and the wiring board 47. The supporting substrate 81 is arranged on the surface 41a of the semiconductor chip 41 through the first adhesive member 24. The circuit formation surfaces 48a of the semiconductor chips 41 to 44 are arranged in a direction opposite to the wiring board 47 toward the supporting substrate side. The supporting substrate 181 before cutting is used. The stacking order of the semiconductor chips is different.

Stacking Process

The plate shaped supporting substrate 181 before cutting is prepared which has the plurality of chip mounting sections 65 which is partitioned by the dicing lines 68 on the other surface 181b.

Figure 13:
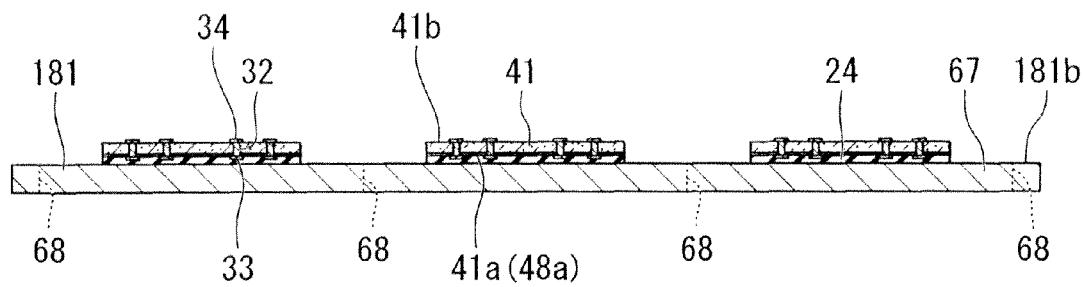
FIG. 13 is a cross sectional view illustrating a semiconductor device in a step involved in a method of forming the semiconductor device of FIG. 12, in the second embodiment of the invention.

After the first adhesive member 24 is coated on the chip mounting sections 65, as shown in FIG. 13, the semiconductor chip 41 of the DRAM core chip having the penetration electrodes 32 and the bonding pads 33 and 34 is stacked on the first adhesive member 24. At this time, the circuit formation surface 48a of the semiconductor chip 41 is faced down and directed toward the supporting substrate 181 before cutting.

Then, the circuit formation surface 48a of the semiconductor chip 42 of the DRAM core chip is arranged face down. The semiconductor chip 42 is mounted on the semiconductor chip 41. At this time, the bonding pads 34 of the other surface side of the semiconductor chip 41 and the bonding pads 33 of one surface side of the semiconductor chip 42 are connected to each other and are temporarily fixed at a low temperature of about 150° C.

The circuit formation surface 48a of the semiconductor chip 43 of the DRAM core chip is faced down direction. The semiconductor chip 43 is mounted on the semiconductor chip 42. At this time, the bonding pads 34 of the other surface side of the semiconductor chip 42 and the bonding pads 33 of one surface side of the semiconductor chip 43 are connected to each other and are temporarily fixed at a low temperature of about 150° C.

Figure 14:
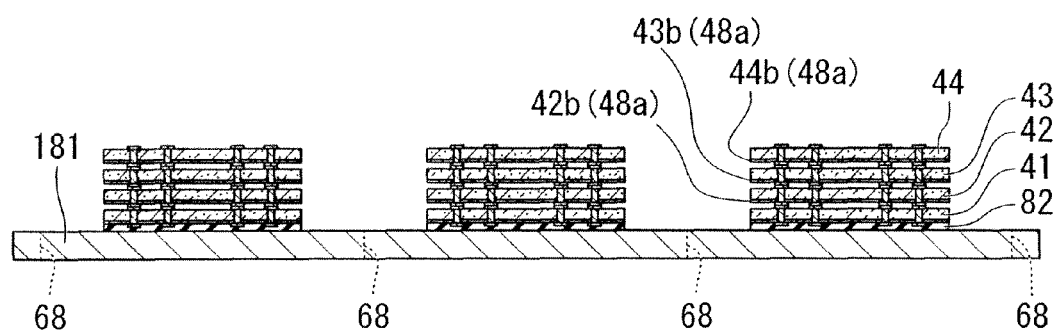
FIG. 14 is a cross sectional view illustrating a semiconductor device in a step subsequent to the step of FIG. 13, involved in the method of forming the semiconductor device of FIG. 12, in the second embodiment of the invention.

As shown in FIG. 14, the circuit formation surface 48a of the semiconductor chip 44 of the DRAM core chip is faced down, while the semiconductor chip 44 is mounted on the semiconductor chip 43. At this time, the bonding pads 34 of the other surface of the semiconductor chip 43 and the bonding pads 33 of one surface side of the semiconductor chip 44 are connected to each other and are temporarily fixed at a low temperature of about 150° C.

Figure 15:
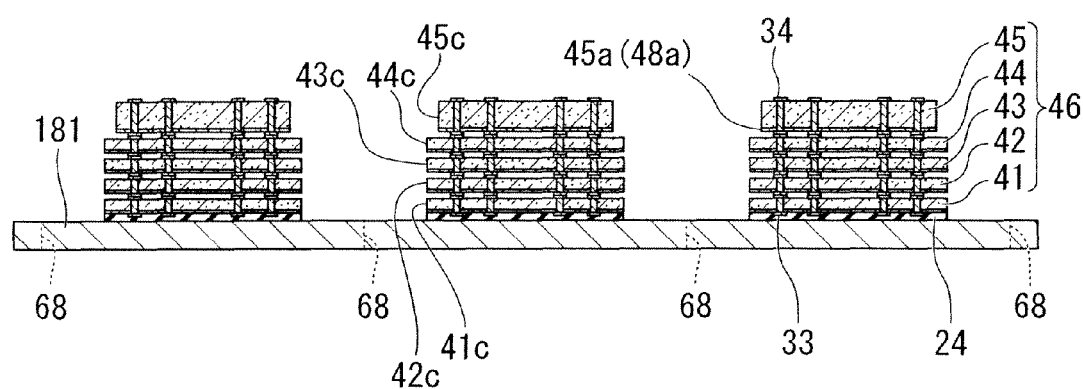
FIG. 15 is a cross sectional view illustrating a semiconductor device in a step subsequent to the step of FIG. 14, involved in the method of forming the semiconductor device of FIG. 12, in the second embodiment of the invention.

As shown in FIG. 15, the circuit formation surface 48a of the semiconductor chip 45 of the IF chip may be faced down. The semiconductor chip 45 may be mounted on the semiconductor chip 44. At this time, the bonding pads 34 of the other surface side of the semiconductor chip 44 and the bonding pads 33 of one surface side of the semiconductor chip 45 may be connected to each other and are temporarily fixed at a low temperature of about 150° C.

In a high temperature state of about 300° C., a mechanical load is applied to the semiconductor chips 41 to 45 toward the wiring board 181 before cutting. The bonding pads 33 of one surface side and the bonding pads 34 of the other surface side of the semiconductor chips 41 to 45 are actually pressure-connected.

Accordingly, as shown in FIG. 15, conduction is secured from the bonding pads 33 of the semiconductor chip 41 to the bonding pads 34 of the fifth semiconductor chip 45. The chip stacked structure 46 is formed by stacking the semiconductor chips 41 to 45.

Sealing Process:

The first sealing member 26 may be supplied in a drop-down method to the side surface of the chip stacked structure 46 which is formed on the supporting substrate 181 before cutting. At this time, the first sealing member 26 fills gaps between the semiconductor chips 41 to 45 due to a capillary tube phenomenon and flows down toward the supporting substrate 181 before cutting due to gravity.

Figure 16:
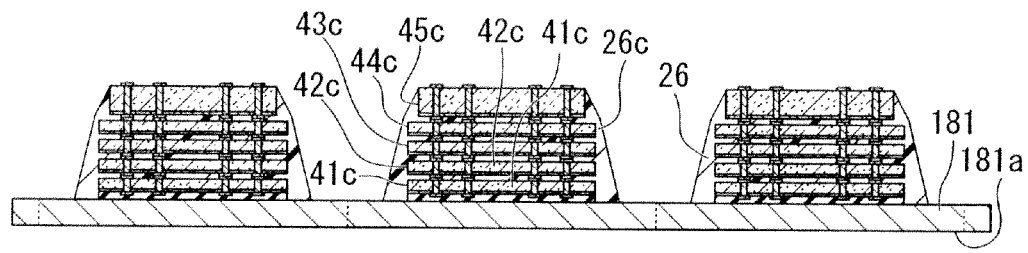
FIG. 16 is a cross sectional view illustrating a semiconductor device in a step subsequent to the step of FIG. 15, involved in the method of forming the semiconductor device of FIG. 12, in the second embodiment of the invention.

As shown in FIG. 16, the first sealing member 26 may be cured by performing a thermal treatment process such as curing at about 150° C. Thus, the first sealing member 26 is formed which covers the side surfaces 41c to 45c of the semiconductor chips 41 to 45. The first sealing member 26 may have a trapezoidal shape in vertical sectional view. The wiring board before cutting 181 is a base. The side surface 26c of the first sealing member 26 is an inclined surface.

In a cooling process after the thermal curing, thermal expansion and contraction of the first sealing member 26 is larger than that of the semiconductor chips 41 to 45. Thermal stress causing concave-bent is applied to the chip stacked structure 46 due to the first sealing member 26. In particular, the supporting substrate 181 before cutting is fixed by a jig not shown. The thermal stress of the bend in the lowest position of the chip stacked structure 46 is suppressed. The thermal stress causing the concave-bend is applied to the respective layers of the chip stacked structure 46. The strongest thermal stress of the concave-bend is applied to the uppermost semiconductor chip 45.

In this embodiment, since the thick semiconductor chip 40 is used as the highest semiconductor chip 45, the thermal stress of the concave-bend can be suppressed, and thus, the semiconductor chips can be prevented from being cracked.

Further, in this embodiment, the width of the uppermost semiconductor chip 45 is reduced. The thermal stress of the groove-shape bend can be further suppressed.

In addition, in the cooling process after the thermal curing, thermal expansion and contraction of an oxide film for forming the circuit formation surface 48a is larger than that of the semiconductor chips 41 to 45. Contraction thermal stress is applied to the circuit formation surface 48a.

In this embodiment, the circuit formation surface 48a of the semiconductor chip 45 is arranged in the face down direction. Thermal stress causing convex-bent is applied to the semiconductor chip 41. Due to the thermal stress which is convex-bent, the thermal stress which is concave-bent due to the thermal stress of the first sealing member 26 can be offset to thereby lessen the thermal stress.

The supporting substrate 181 before cutting, in which the first sealing member 26 is formed, is arranged on a lower mold 71 of a transfer mold apparatus so that one surface 181a becomes a lower side.

Then, an upper mold 72 is arranged through a sheet 74 which is formed of elastic material. A cavity 73 is formed in the upper mold 72. A plurality of chip stacked bodies 46 which are spaced from each other and arranged on the supporting substrate 181 before cutting may be brought together in a batch in the cavity 73. Further, a gate section 75 which connects the cavity 73 to the outside is installed in the upper mold 72.

Figure 17:
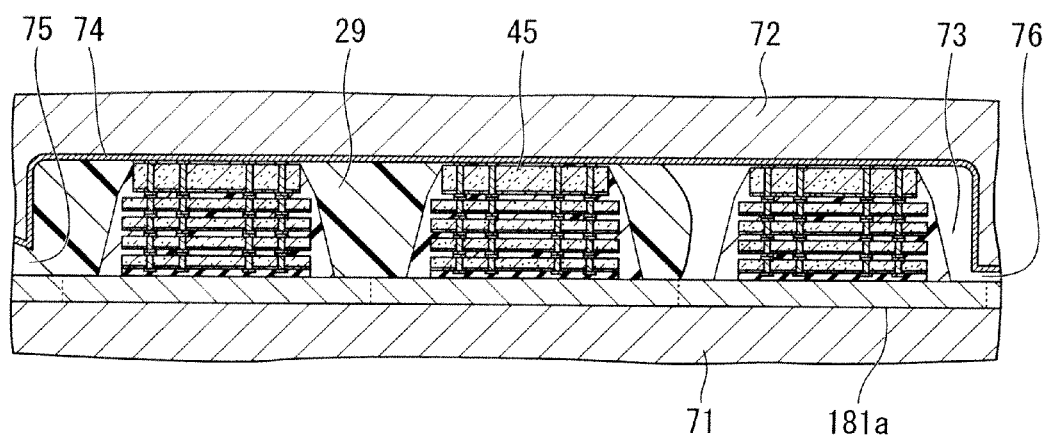
FIG. 17 is a cross sectional view illustrating a semiconductor device in a step subsequent to the step of FIG. 16, involved in the method of forming the semiconductor device of FIG. 12, in the second embodiment of the invention.

As shown in FIG. 17, the second sealing member 29 is injected through the gate section 75 toward an air vent section 76 and is heated and molten inside the cavity 73. The second sealing member 29 may be made of a sealing resin.

The sealing member 29 is cured under predetermined conditions. For example, in the case where thermal curing resin such as epoxy resin is used as the sealing resin, thermal treatment such as curing is performed at about 180° C. Baking is performed at a predetermined temperature, to thereby completely cure the second sealing member 29.

By closing the lower mold 71 and the upper mold 72 through the sheet 74 which is formed of elastic material, the sheet 74 can be adhered to the top surface sides of the chip stacked bodies 46. The second sealing member 29 can be prevented from flowing onto the top surface sides of the chip stacked bodies 46. When removing the upper mold 72 and the sheet 74, the bonding pads 34 of the other surface sides of the chip stacked bodies 46 may be in an exposed state.

Figure 18:
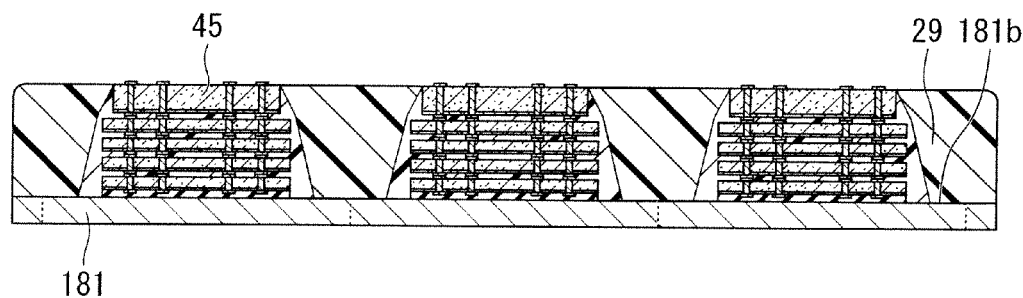
FIG. 18 is a cross sectional view illustrating a semiconductor device in a step subsequent to the step of FIG. 17, involved in the method of forming the semiconductor device of FIG. 12, in the second embodiment of the invention.

As shown in FIG. 18, the supporting substrate 181 before cutting in which the second sealing member 29 is formed is obtained by removing the upper mold 71 and the lower mold 72. The other surface side 181b is arranged in an upper direction.

As shown in FIG. 18, the plurality of chip stacked bodies 46 is covered by the second sealing member 29 in a batch, but the bonding pads 34 of the other surface side of the semiconductor chip 45 are exposed.

Figure 19:
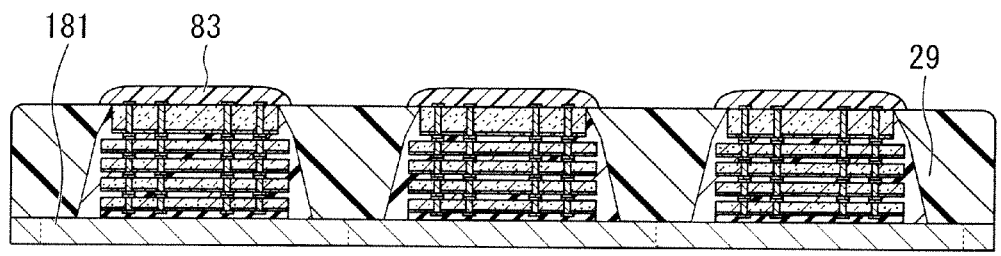
FIG. 19 is a cross sectional view illustrating a semiconductor device in a step subsequent to the step of FIG. 18, involved in the method of forming the semiconductor device of FIG. 12, in the second embodiment of the invention.

Wiring Board Mounting Process:

As shown in FIG. 19, a second adhesive member 27 which is made of NCP is selectively supplied to cover only the exposed surface of the semiconductor 45.

Figure 20:
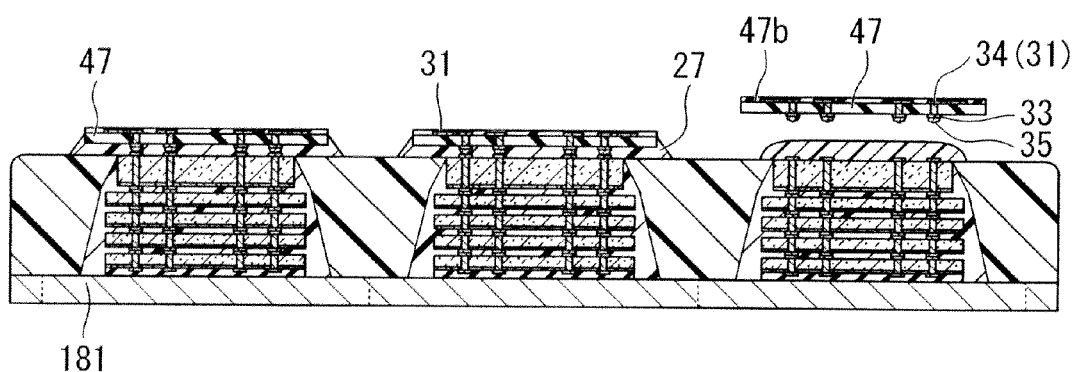
FIG. 20 is a cross sectional view illustrating a semiconductor device in a step subsequent to the step of FIG. 19, involved in the method of forming the semiconductor device of FIG. 12, in the second embodiment of the invention.

As shown in FIG. 20, the wiring board 47, in which the wire bumps 35 which are made of Au are connected with the bonding pads 33 of one surface side thereof, is mounted on the semiconductor chip 45 through the second adhesive member 27. At this time, by pressing the wiring board 47, the second adhesive member 27 is expanded toward the side surfaces of the wiring board 47. Thereafter, the second adhesive member 27 is cured to fixedly adhere the wiring board 47 onto the chip stacked structure Ball Mounting Process:

External terminals 28 which are made of conductive metallic balls such as solder balls are adsorbed and held in a plurality of adsorption holes not shown which is formed in installation surfaces 77b of a ball mounting tool 77 of a ball mounter not shown. The adsorption holes are formed to correspond to the arrangement of the plurality of lands 31.

Flux is transferred to the external terminals 28 which are made of the solder balls and which are adsorbed and held.

Then, the external terminals 28 which are made of the solder balls are mounted on the bonding pads 34 or lands 31 of the other surface side, which is formed on the other surface side 47b of the wiring board 47. The external terminals 28 are mounted on all the chip stacked bodies 46, and then, the wiring board 47 is heated and reflowed to fix the external terminals 28. Thus, the supporting substrate 181 before cutting is obtained in which the external terminals 28 are formed.

Dicing Process:

A dicing tape 79 is attached to one surface 181a of the supporting substrate 181 before cutting.

Figure 21:
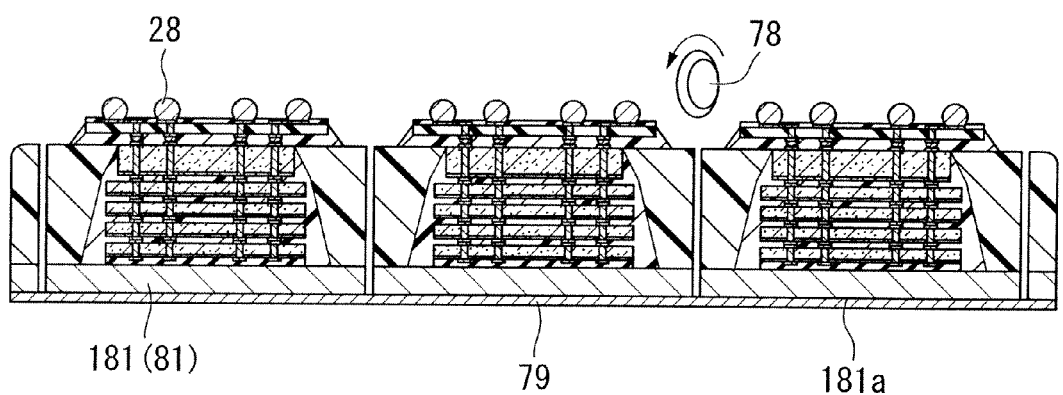
FIG. 21 is a cross sectional view illustrating a semiconductor device in a step subsequent to the step of FIG. 20, involved in the method of forming the semiconductor device of FIG. 12, in the second embodiment of the invention.

As shown in FIG. 21, the supporting substrate 181 before cutting is cut along the dicing lines 68 in a lattice pattern in longitudinal and transverse directions, by a dicing blade 78, to obtain the supporting substrates 81.

The semiconductor device 12 according to the embodiment of the invention is obtained by being picked up from the dicing tape 79.

In the semiconductor device 12 according to the embodiment of the invention, the thick semiconductor chip 40 is arranged toward the wiring board 47 of the chip stacked structure 46. The supporting substrate 81 is arranged opposite to the wiring board 47 of the chip stacked structure 46. Even though the thickness of the thin semiconductor chip 39 is reduced to reduce the semiconductor device, the thick semiconductor chip 40 suppresses the bend of the groove shape due to the thermal stress. A bending resistance characteristic against the bend of the chip stacked structure 46 which is made of two or more semiconductor chips 41 to 45 can be improved. Cracks of the semiconductor chips 41 to 45 can be suppressed.

In the method of forming the semiconductor device according to the embodiment, the dicing process is performed while the wiring board 47 is arranged on the thick semiconductor chip 40 which is opposite to the supporting substrate 181 before cutting in the stacking process. The supporting substrate 181 is used before cutting which includes two or more chip mounting sections 65 on which the semiconductor chips are mounted. After the sealing process, the supporting substrate 181 is cut to obtain the supporting substrate 81. Even though the thickness of the thin semiconductor chip 39 is reduced to reduce the thickness of the semiconductor device, the thick semiconductor chip 40 suppresses the bend of the groove shape due to the thermal stress. This thereby improves a bending resistance characteristic against the bend of the chip stacked structure 46 which is made of two or more semiconductor chips 41 to 45. Cracks of the semiconductor chips 41 to 45 can be suppressed. The thin semiconductor device can be easily manufactured.

Comparative Example 1

Figure 22:
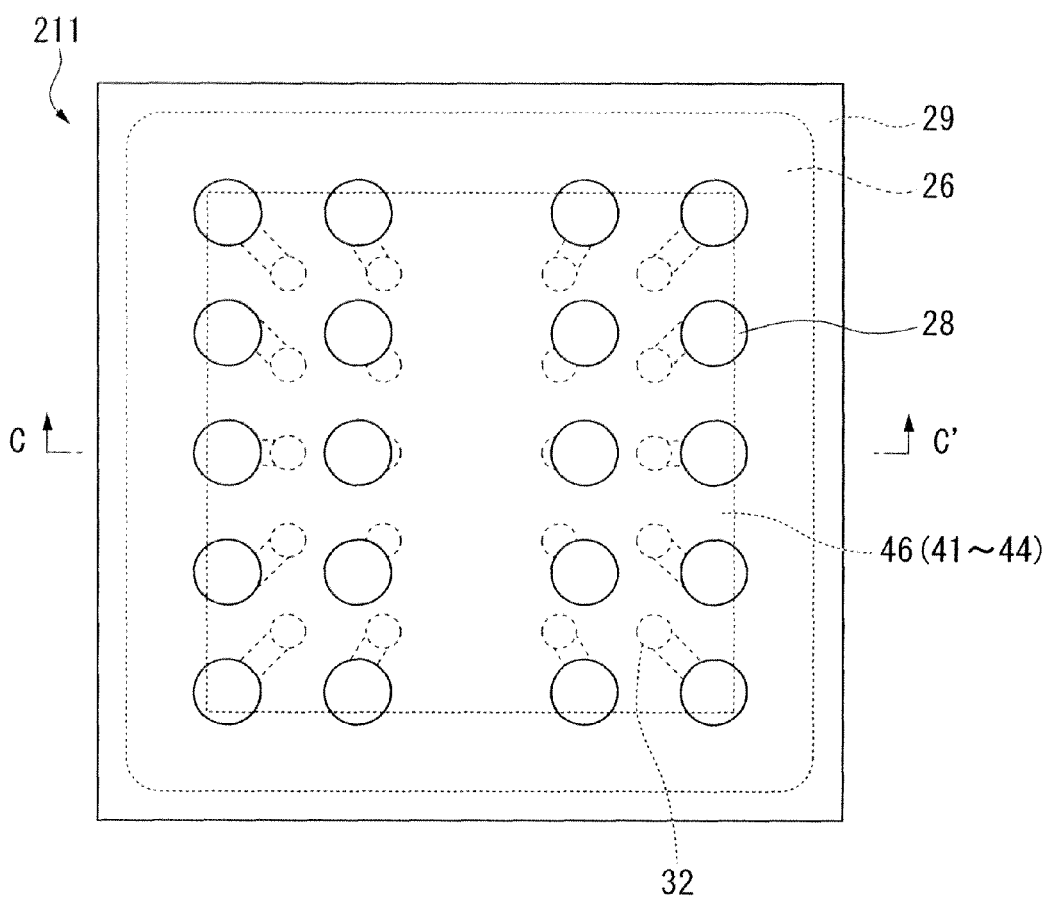
FIG. 22 is a perspective bottom view illustrating the semiconductor device of the comparative example.
Figure 23:
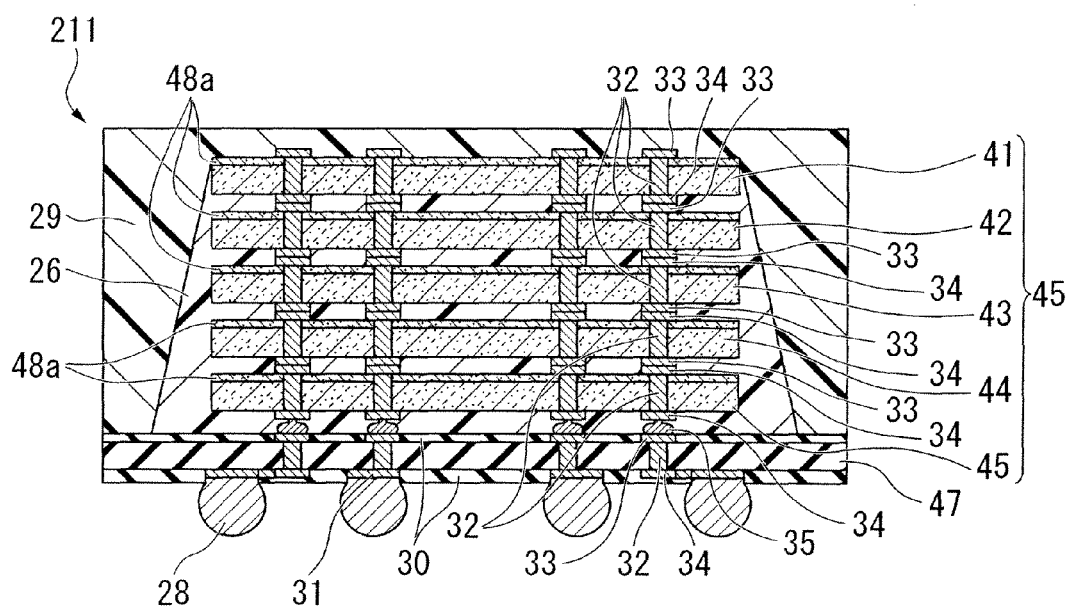
FIG. 23 is a sectional view taken along line C-C' in FIG. 22.

A semiconductor device 211 of a comparative example 1 shown in FIGS. 22 and 23 was manufactured. FIG. 22 is a perspective bottom view illustrating the semiconductor device of the comparative example. FIG. 23 is a sectional view taken along line C-C' in FIG. 22.

As shown in FIGS. 22 and 23, the semiconductor device 211 of the comparative example has the same structure as in the semiconductor device 11 according to the first embodiment, except the followings. The semiconductor chip 41 which forms the chip stacked structure 46 was a thin semiconductor chip, and circuit formation surfaces 48a of the semiconductor chips 41 to 44 are arranged opposite to the wiring board 47. The same reference numbers are given to the same elements as in the first embodiment.

In the method of forming the semiconductor device according to the first embodiment, underfill material which is the second sealing member fills gaps between the semiconductor chips 41 to 45 of the chip stacked structure 46 and side surfaces thereof. When the underfill material was heated and cooled for thermal curing, a bend was caused in the uppermost semiconductor chip, and cracks were caused in the uppermost semiconductor chip.

The present invention relates to a semiconductor device and a method of forming the semiconductor device, and more particularly, to a CoC semiconductor device and a method of forming the semiconductor device. The semiconductor device is formed to be thin. Bend of the semiconductor chip due to the thermal stress is suppressed to thereby suppress chip cracks.

As used herein, the following directional terms "over, under, forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A device comprising:
   a wiring circuit board; and
   a plurality of semiconductor chips that are stacked with each other on the wiring circuit board, the plurality of semiconductor chips including an uppermost semiconductor chip and an other semiconductor chip over which the uppermost semiconductor chip is stacked,
   wherein the uppermost semiconductor chip includes a circuit layer in which a memory circuit is formed, and the other semiconductor chip includes a circuit layer in which an interface circuit is formed,
   wherein the circuit layer of the uppermost semiconductor chip is formed on a surface which faces down toward the other semiconductor chip and the wiring circuit board,
   wherein the circuit layer of the other semiconductor chip is formed on a surface which faces up toward the uppermost semiconductor chip,
   wherein the uppermost semiconductor chip and the other semiconductor chip each further includes four or more bonding pads, each of the four or more bonding pads of the uppermost semiconductor chip being vertically aligned with and electrically connected to an associated one of the four or more bonding pads of the other semiconductor chip, and
   wherein the uppermost semiconductor chip is greater in thickness than the other semiconductor chip.

2. The device as claimed in claim 1, wherein the memory circuit in the uppermost semiconductor chip includes a dynamic random access memory (DRAM) circuit so that the uppermost semiconductor chip serves as a DRAM core chip.

3. The device as claimed in claim 1, wherein each of the plurality of semiconductor chips includes a plurality of penetration electrodes, each penetrating an associated one of the plurality of semiconductor chips,
   the plurality of semiconductor chips being stacked such that each of the penetration electrodes of a lower one of the plurality of semiconductor chips is connected to an associated one of the penetration electrodes of an upper one of the plurality of semiconductor chips.

4. The device as claimed in claim 1, further comprising:
a first sealing member covering the plurality of semiconductor chips.

5. The device as claimed in claim 1, wherein the interface circuit in the other semiconductor chip controls an input and output of data of the uppermost semiconductor chip.

6. The device as claimed in claim 1, wherein a thickness of the uppermost semiconductor chip is greater than 1.5 times a thickness of the other semiconductor chip.

7. The device as claimed in claim 1, further comprising:
a first sealing member formed on the other semiconductor chip and between the wiring circuit board and the other semiconductor chip, and having an inclined side surface; and
a second sealing member formed on uppermost semiconductor chip, the other semiconductor chip and the first sealing member.

8. The device as claimed in claim 7, wherein the plurality of semiconductor chips are stacked on a surface of the wiring circuit board, and the first and second sealing members contact the surface of the wiring circuit board.

9. A device comprising:
a wiring circuit board; and
first, second, third and fourth semiconductor memory chips disposed over the wiring circuit board, each of the first, second, third and fourth semiconductor memory chips including first and second main surfaces opposed to each other,
a fifth semiconductor chip that is different in circuit configuration from each of the first, second, third and fourth semiconductor memory chips, the fifth semiconductor chip being disposed between the first semiconductor memory chip and the wiring circuit board without an intervention of any other semiconductor chip, and the wiring circuit board including a first surface facing the fifth semiconductor chip, a second surface opposite to the first surface and a plurality of external terminals provided on the second surface,
each of the first, second, third and fourth semiconductor memory chips including, on a side of the first main surface, a circuit layer and four or more bonding pads, the circuit layer of each of the first, second, third and fourth semiconductor memory chips comprising a memory circuit therein,
the fifth semiconductor chip including, on a side of the first main surface, a circuit layer comprising an interface circuit,
the first, second, third and fourth semiconductor memory chips being stacked with each other to provide a stacked chip structure in which the second and third semiconductor chips are sandwiched between the first and fourth semiconductor memory chips and the four or more bonding pads of the first, second, third and fourth semiconductor memory chips are vertically aligned with and electrically connected to each other, respectively, and
the fourth semiconductor memory chip having a thickness that is greater than a thickness of each of the first, second and third semiconductor memory chips, and the first main surface of the fourth semiconductor memory chip facing down toward the third semiconductor memory chip and the wiring circuit board, the first main surface of the fifth semiconductor chip facing up toward the first, second, third and fourth semiconductor memory chips.

10. The device as claimed in claim 9, wherein the first, second and third semiconductor memory chips have a substantially equal thickness.

11. The device as claimed in claim 9, wherein the stacked chip structure is stacked over the wiring circuit board such that the first, second, and third semiconductor memory chips, and the fifth semiconductor chip are sandwiched between the fourth semiconductor memory chip and the wiring circuit board.

12. The device as claimed in claim 11, further comprising:
a first sealing member covering the first, second and third semiconductor memory chips, and the fifth semiconductor chip; and
a second sealing member formed on the wiring circuit board to cover the first, second, third and, fourth semiconductor memory chips, the fifth semiconductor chip and the first sealing member.

13. The device as claimed in claim 9, further comprising:
a first sealing member covering the first, second and third semiconductor memory chips, and the fifth semiconductor chip.

14. A device comprising:
a wiring circuit board; and
a first semiconductor chip comprising a first circuit configuration and formed on the wiring circuit board; and
a stacked chip structure in which a plurality of second semiconductor chips are stacked with each other, each of the second semiconductor chips comprising a second circuit configuration that is different from the first circuit configuration and being controlled by the first semiconductor chip,
the stacked chip structure being stacked over the first semiconductor chip such that a lowermost second semiconductor chip of the stacked chip structure is sandwiched between the first semiconductor chip and an uppermost second semiconductor chip of the stacked chip structure,
the uppermost second semiconductor chip of the plurality of second semiconductor chips being greater in thickness than the lowermost second semiconductor chip of the plurality of second semiconductor chips,
wherein each of the second semiconductor chips includes a circuit layer in which a memory circuit is formed, the circuit layer of the uppermost second semiconductor chip being formed on a surface of the uppermost second semiconductor chip which faces down toward the lowermost second semiconductor chip and the wiring circuit board,
wherein the first circuit configuration of the first semiconductor chip includes a circuit layer in which an interface circuit is formed, the circuit layer of the first semiconductor chip faces up toward the stacked chip structure of the second semiconductor chips, and
each of the second semiconductor chips further includes a plurality of bonding pads of the second semiconductor chips that are equal in alignment and arrangement to each other.

15. The device as claimed in claim 14, wherein the uppermost second semiconductor chip is greater in thickness than the first semiconductor chip.

16. The device as claimed in claim 15, wherein the lowermost second semiconductor chip is substantially equal in thickness to the first semiconductor chip.

17. The device as claimed in claim 15, wherein the first semiconductor chip is stacked over the wiring circuit board such that the first semiconductor chip is sandwiched between the wiring circuit board and the stacked chip structure without any other chip intervening between the first semiconductor chip and the lowermost second semiconductor chip of the stacked chip structure, and wherein the wiring circuit board includes a first surface facing toward the first semiconductor chip and a second surface opposite to the first surface, and a plurality of external terminals provided on the second surface.

18. The device as claimed in claim 17, further comprising a first sealing member covering the first semiconductor chip and the stacked chip structure; and a second sealing member formed on the wiring circuit board to cover the first semiconductor chip, the stacked chip structure and the first sealing member.

19. The device as claimed in claim 17, wherein the uppermost second semiconductor chip of the stacked chip structure includes a circuit portion that forms the second circuit configuration, and a circuit side of the uppermost second semiconductor chip faces the wiring circuit board.

20. The device as claimed in claim 14, wherein the first semiconductor chip serves as an interface chip and each of the second semiconductor chips serves as a memory chip controlled by the interface chip.

21. The device as claimed in claim 14, further comprising:
a first sealing member covering the first semiconductor chip and the stacked chip structure.

22. The device as claimed in claim 14, wherein the uppermost second semiconductor chip is farthest in a direction of stacking the second semiconductor chips.

23. A device comprising:
a wiring circuit board including first and second main surfaces opposite to each other and a plurality of solder balls formed on side of the first main surface;
a first semiconductor chip mounted on a side of the second main surface of the wiring circuit board; and
a plurality of second semiconductor chips each controlled by the first semiconductor chip, the second semiconductor chips being stacked with each other to provide a stacked chip structure,
the stacked chip structure being stacked on the first semiconductor chip such that the first semiconductor chip is between the wiring circuit board and the stacked chip structure,
an uppermost one of the second semiconductor chips being greater in thickness than remaining one or ones of the second semiconductor chips,
the remaining one or ones of the second semiconductor chips being between the first semiconductor chip and the uppermost one of the second semiconductor chips,
wherein each of the second semiconductor chips includes a circuit layer in which a memory circuit is formed, the circuit layer of the uppermost second semiconductor chip being formed on a surface of the uppermost second semiconductor chip which faces down toward the first semiconductor chip and the wiring circuit board, and
wherein the first semiconductor chip includes a circuit layer in which an interface circuit is formed, the circuit layer of the first semiconductor chip facing up toward the stacked chip structure of the plurality of the second semiconductor chips.

24. The device as claimed in claim 23, wherein each of the second semiconductor chips further includes four or more bonding pads, each of the four or more bonding pads of the uppermost second semiconductor chip is vertically aligned with and electrically connected to an associated one of the four or more bonding pads of the remaining one or ones of the second semiconductor chips.

* * * * *